(12) United States Patent
Gu et al.

(10) Patent No.: US 9,577,025 B2
(45) Date of Patent: Feb. 21, 2017

(54) METAL-INSULATOR-METAL (MIM) CAPACITOR IN REDISTRIBUTION LAYER (RDL) OF AN INTEGRATED DEVICE

(71) Applicant: QUALCOMM Incorporated, San Diego, CA (US)

(72) Inventors: Shiqun Gu, San Diego, CA (US); Ryan David Lane, San Diego, CA (US); Glenn David Raskin, San Diego, CA (US); Shree Krishna Pandey, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 14/181,522

(22) Filed: Feb. 14, 2014

(65) Prior Publication Data

US 2015/0221714 A1   Aug. 6, 2015

Related U.S. Application Data

(60) Provisional application No. 61/934,613, filed on Jan. 31, 2014.

(51) Int. Cl.
*H01L 49/02* (2006.01)
*H01L 23/00* (2006.01)
(Continued)

(52) U.S. Cl.
CPC ........... *H01L 28/60* (2013.01); *H01L 23/5223* (2013.01); *H01L 23/5383* (2013.01); *H01L 23/5389* (2013.01); *H01L 24/02* (2013.01); *H01L 24/19* (2013.01); *H01L 24/96* (2013.01); *H01L 2224/0231* (2013.01); *H01L 2224/02331* (2013.01); *H01L 2224/02371* (2013.01); *H01L 2224/02373* (2013.01); *H01L 2224/02381* (2013.01); *H01L 2224/0401* (2013.01); (Continued)

(58) Field of Classification Search
CPC .......................... H01L 23/5222; H01L 23/5223
See application file for complete search history.

(56) References Cited

U.S. PATENT DOCUMENTS 6,452,251 B1 *  9/2002  Bernstein ............ H01L 23/5223
                                                                257/301
6,678,144 B2 *  1/2004  Higashi et al. ............. 361/306.3
(Continued)

OTHER PUBLICATIONS

International Search Report and Written Opinion—PCT/US2015/013547—ISA/EPO—Apr. 23, 2015.

*Primary Examiner* — Matthew Landau
*Assistant Examiner* — Grant Withers
(74) *Attorney, Agent, or Firm* — Loza & Loza, LLP

(57) ABSTRACT

Some features pertain to an integrated device that includes a substrate, several metal layers coupled to the substrate, several dielectric layers coupled to the substrate, and a redistribution portion coupled to one of the metal layers. The redistribution portion includes a first metal redistribution layer, an insulation layer coupled to the first metal redistribution layer, and a second metal redistribution layer coupled to the insulation layer. The first metal redistribution layer, the insulation layer, and the second metal redistribution layer are configured to operate as a capacitor in the integrated device. In some implementations, the capacitor is a metal-insulator-metal (MIM) capacitor.

32 Claims, 24 Drawing Sheets

(51) Int. Cl.
*H01L 23/538* (2006.01)
*H01L 23/522* (2006.01)

(52) U.S. Cl.
CPC ............ *H01L 2224/04105* (2013.01); *H01L 2224/05572* (2013.01); *H01L 2224/12105* (2013.01); *H01L 2224/24137* (2013.01); *H01L 2924/1205* (2013.01)

(56) References Cited

U.S. PATENT DOCUMENTS

| | | | | |
|---|---|---|---|---|
| 6,710,425 | B2* | 3/2004 | Bothra | 257/532 |
| 7,144,759 | B1* | 12/2006 | Hilton | H01L 21/4857 257/E21.503 |
| 7,155,244 | B2* | 12/2006 | Edge | 455/502 |
| 7,566,634 | B2* | 7/2009 | Beyne | H01L 21/78 257/E21.238 |
| 7,667,279 | B2* | 2/2010 | Nakashiba | 257/409 |
| 7,679,123 | B2 | 3/2010 | Oh et al. | |
| 8,164,158 | B2 | 4/2012 | Lin | |
| 8,237,228 | B2* | 8/2012 | Or-Bach et al. | 257/369 |
| 8,378,494 | B2* | 2/2013 | Or-Bach et al. | 257/773 |
| 2002/0192919 | A1* | 12/2002 | Bothra | H01L 28/60 438/381 |
| 2003/0227095 | A1 | 12/2003 | Fujisawa et al. | |
| 2004/0113190 | A1* | 6/2004 | Oh | H01L 21/76801 257/296 |
| 2004/0207043 | A1* | 10/2004 | Matsunaga et al. | 257/534 |
| 2004/0232497 | A1* | 11/2004 | Akiyama et al. | 257/390 |
| 2004/0238957 | A1* | 12/2004 | Akram et al. | 257/738 |
| 2004/0253783 | A1* | 12/2004 | Egashira et al. | 438/232 |
| 2005/0001307 | A1* | 1/2005 | Huang | 257/690 |
| 2006/0086964 | A1* | 4/2006 | Tanaka | 257/306 |
| 2006/0145293 | A1* | 7/2006 | Cho | 257/532 |
| 2006/0214265 | A1* | 9/2006 | Goebel et al. | 257/533 |
| 2006/0252240 | A1* | 11/2006 | Gschwandtner et al. | 438/584 |
| 2006/0255428 | A1* | 11/2006 | Torii | 257/532 |
| 2007/0023862 | A1* | 2/2007 | Takagi | 257/531 |
| 2007/0152295 | A1* | 7/2007 | Yeh et al. | 257/516 |
| 2007/0152337 | A1* | 7/2007 | Han | 257/758 |
| 2007/0155091 | A1* | 7/2007 | Park | 438/253 |
| 2007/0164431 | A1* | 7/2007 | Lee et al. | 257/737 |
| 2007/0190718 | A1* | 8/2007 | Coolbaugh et al. | 438/253 |
| 2007/0216027 | A1* | 9/2007 | Okamura | 257/737 |
| 2007/0216029 | A1* | 9/2007 | Tsai | 257/758 |
| 2007/0235790 | A1* | 10/2007 | Kim et al. | 257/306 |
| 2007/0262417 | A1* | 11/2007 | Ohtake et al. | 257/532 |
| 2007/0278619 | A1* | 12/2007 | Clevenger et al. | 257/532 |
| 2008/0050874 | A1* | 2/2008 | Won et al. | 438/250 |
| 2008/0054426 | A1* | 3/2008 | Ohno et al. | 257/678 |
| 2008/0055816 | A1* | 3/2008 | Park et al. | 361/301.4 |
| 2008/0179750 | A1* | 7/2008 | Arnal et al. | 257/758 |
| 2008/0191311 | A1* | 8/2008 | Wang et al. | 257/532 |
| 2008/0239618 | A1* | 10/2008 | Cremer et al. | 361/302 |
| 2008/0296730 | A1* | 12/2008 | Nakao et al. | 257/532 |
| 2008/0296772 | A1* | 12/2008 | Nakao et al. | 257/761 |
| 2009/0065836 | A1* | 3/2009 | Kim | 257/296 |
| 2009/0073633 | A1* | 3/2009 | Tews et al. | 361/301.1 |
| 2009/0115023 | A1* | 5/2009 | Kim | 257/532 |
| 2009/0140308 | A1* | 6/2009 | Inoue et al. | 257/296 |
| 2009/0160020 | A1* | 6/2009 | Barth et al. | 257/532 |
| 2009/0166880 | A1* | 7/2009 | Chabert et al. | 257/773 |
| 2009/0230542 | A1* | 9/2009 | Lin et al. | 257/700 |
| 2009/0243108 | A1* | 10/2009 | Gosset et al. | 257/758 |
| 2009/0309212 | A1* | 12/2009 | Shim et al. | 257/700 |
| 2010/0006912 | A1* | 1/2010 | Larsen et al. | 257/296 |
| 2010/0059806 | A1* | 3/2010 | Mizushima | 257/301 |
| 2010/0065942 | A1* | 3/2010 | Lin et al. | 257/531 |
| 2010/0065944 | A1* | 3/2010 | Tu et al. | 257/532 |
| 2010/0224960 | A1* | 9/2010 | Fischer | 257/532 |
| 2010/0301451 | A1* | 12/2010 | Iwaki | 257/532 |
| 2011/0039409 | A1* | 2/2011 | Arikawa | 438/667 |
| 2011/0062549 | A1* | 3/2011 | Lin | 257/531 |
| 2011/0156205 | A1* | 6/2011 | Maki et al. | 257/531 |
| 2011/0156208 | A1* | 6/2011 | Kaneko et al. | 257/532 |
| 2011/0157777 | A1* | 6/2011 | Dundulachi | 361/524 |
| 2011/0210422 | A1* | 9/2011 | Imamura et al. | 257/532 |
| 2011/0284991 | A1* | 11/2011 | Hijioka et al. | 257/532 |
| 2011/0299337 | A1* | 12/2011 | Parris et al. | 365/185.18 |
| 2012/0112314 | A1* | 5/2012 | Jou et al. | 257/532 |
| 2012/0133020 | A1* | 5/2012 | Joblot et al. | 257/532 |
| 2012/0161279 | A1* | 6/2012 | Lin et al. | 257/531 |
| 2012/0193760 | A1* | 8/2012 | Manabe et al. | 257/532 |
| 2012/0223412 | A1* | 9/2012 | Baars et al. | 257/532 |
| 2013/0037910 | A1* | 2/2013 | Tzeng et al. | 257/532 |
| 2013/0043560 | A1* | 2/2013 | Tzeng et al. | 257/532 |
| 2013/0181325 | A1* | 7/2013 | Chen et al. | 257/532 |
| 2013/0307119 | A1* | 11/2013 | Chen et al. | 257/532 |
| 2013/0341785 | A1* | 12/2013 | Fu | H01L 23/3192 257/737 |
| 2014/0021583 | A1* | 1/2014 | Lo et al. | 257/532 |
| 2014/0084391 | A1* | 3/2014 | Lenive et al. | 257/414 |
| 2014/0097890 | A1* | 4/2014 | Li et al. | 327/551 |
| 2014/0144681 | A1* | 5/2014 | Pushparaj et al. | 174/257 |
| 2014/0145307 | A1* | 5/2014 | Chen et al. | 257/535 |
| 2014/0159198 | A1* | 6/2014 | Ren et al. | 257/532 |
| 2014/0183690 | A1* | 7/2014 | Lii et al. | 257/531 |
| 2014/0225222 | A1* | 8/2014 | Yu et al. | 257/532 |
| 2014/0225223 | A1* | 8/2014 | Zhu et al. | 257/532 |
| 2014/0225224 | A1* | 8/2014 | Zhu et al. | 257/532 |
| 2014/0225280 | A1* | 8/2014 | Henderson et al. | 257/777 |
| 2014/0252633 | A1* | 9/2014 | Tsai et al. | 257/773 |
| 2014/0264748 | A1* | 9/2014 | Fujiwara et al. | 257/532 |
| 2014/0319652 | A1* | 10/2014 | Lee et al. | 257/531 |
| 2014/0319653 | A1* | 10/2014 | Fornara et al. | 257/532 |
| 2014/0332871 | A1* | 11/2014 | Kim et al. | 257/296 |
| 2014/0374877 | A1* | 12/2014 | Oh et al. | 257/532 |
| 2015/0014812 | A1* | 1/2015 | Lan et al. | 257/532 |
| 2015/0069570 | A1* | 3/2015 | Shih | 257/508 |
| 2015/0093881 | A1* | 4/2015 | Chen et al. | 438/460 |

\* cited by examiner

METAL-INSULATOR-METAL (MIM) CAPACITOR IN REDISTRIBUTION LAYER (RDL) OF AN INTEGRATED DEVICE

The present application claims priority to U.S. Provisional Application No. 61/934,613, entitled "Metal-Insulator-Metal (MIM) Capacitor in Redistribution Layer (RDL) of An Integrated Device", filed Jan. 31, 2014, which is hereby expressly incorporated by reference herein.

BACKGROUND

Field

Various features relate to a metal-insulator-metal (MIM) capacitor in redistribution layer of an integrated device.

Background

A typical die is manufactured by depositing several metal layers and several dielectric layers on top of a substrate. The die is manufactured by using a wafer level packaging (WLP) process. FIG. 1 illustrates a side view of a wafer. Specifically, FIG. 1 illustrates a side view of a portion of a wafer 100. The wafer 100 includes several metal and dielectric layers 102, a pad 104, a passivation layer 106, a first insulation layer 108, a first metal layer 110, a second insulation layer 112, and an under bump metallization (UBM) layer 114. FIG. 1 also illustrates a solder ball 116 on the wafer 100. Specifically, the solder ball 116 is coupled to the UBM layer 114. The pad 104, the first metal layer 110 and the UBM layer 114 are a conductive material (e.g., copper). The first insulation layer 108 and the second insulation layer 112 are polyimide layers (PI), Polybenzoxazole (PBO) or other polymer layers used for repassivation.

In some electronic designs, a capacitor may be required. For example a decoupling capacitor may be needed in a power distribution network (PDN) for a die. In a traditional electronic design, the capacitor may be placed outside of the package. For example, the package that includes a die may be coupled to a printed circuit board (PCB). A capacitor may be coupled to the PCB. Thus, the capacitor may be coupled to the package that includes a die through the PCB. One downside of this approach is that the capacitor may be far away from die. In some instance, it may be ideal and/or optimal to have the capacitor as close as possible to the die. For instance, it may be ideal and/or optimal to have the capacitor coupled to the die and/or die package, while at the same time bypassing a PCB. Moreover, adding a capacitor will increase the height of the package, which is not desirable in mobile applications.

Therefore, there is a need for a design that provides a capacitor in an integrated device (e.g., a die, die package).

SUMMARY

Various features, apparatus and methods described herein provide a MIM capacitor in redistribution layer of an integrated device.

A first example provides an integrated device that includes a substrate and a redistribution structure coupled to the substrate. The redistribution structure includes a first metal redistribution layer, an insulation layer coupled to the first metal redistribution layer, and a second metal redistribution layer coupled to the insulation layer. The first metal redistribution layer, the insulation layer, and the second metal redistribution layer are configured to operate as a capacitor in the integrated device.

According to an aspect, the redistribution structure further comprises a set of dielectric layers that encapsulates the first metal layer, the insulation layer, and the second metal layer.

According to one aspect, the insulation layer is a high k dielectric layer.

According to an aspect, the second metal layer is one of at least titanium (Ti), (TiN), Aluminium Copper (AlCu), titanium copper alloy (TiCu) and/or titanium tungsten copper alloy (TiWCu).

According to one aspect, the redistribution structure is indirectly coupled to the substrate.

According to an aspect, the second metal layer is on a surface of the integrated device.

According to one aspect, the integrated device of claim 1, further comprising a first die coupled to the substrate. In some implementations, the redistribution structure is coupled to the first die and the substrate.

According to an aspect, the integrated device is one of at least a die, die package, and/or an integrated package device.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus comprising a substrate and a redistribution structure coupled to the substrate. The redistribution structure includes a first interconnect means; an insulating means coupled to the first interconnect means; and a second interconnect means coupled to the insulating means, wherein the first interconnect means, the insulating means, and the second interconnect means are configured to operate as a capacitor in the apparatus.

According to an aspect, the redistribution structure further comprises a set of dielectric layers that encapsulates the first interconnect means, the insulating means, and the second interconnect means.

According to one aspect, the insulating means is a high k dielectric layer.

According to an aspect, the second interconnect means is one of at least titanium (Ti), (TiN), Aluminium Copper (AlCu), titanium copper alloy (TiCu) and/or titanium tungsten copper alloy (TiWCu).

According to one aspect, the redistribution structure is indirectly coupled to the substrate.

According to an aspect, the second interconnect means is on a surface of the apparatus.

According to one aspect, the apparatus further comprises a first die coupled to the substrate. In some implementations, the redistribution structure is coupled to the first die and the substrate.

According to one aspect, the apparatus is one of at least a die, die package, and/or an integrated package device.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for manufacturing a capacitor in an integrated device. The method forms a substrate. The method forms a redistribution structure such that the redistribution structure is coupled to the substrate. In some implementations, forming the redistribution structure includes forming a first metal layer of the capacitor, forming an insulation layer of the capacitor, where the insulation layer is coupled to the first metal layer, and forming a second metal layer of the capacitor, where the second metal layer is coupled to the insulation layer.

According to an aspect, forming the redistribution structure further includes forming a set of dielectric layers that encapsulates the first metal layer, the insulation layer, and the second metal layer.

According to an aspect, the insulation layer is a high k dielectric layer.

According to an aspect, the second metal layer is one of at least titanium (Ti), (TiN), Aluminium Copper (AlCu), titanium copper alloy (TiCu) and/or titanium tungsten copper alloy (TiWCu).

According to an aspect, the redistribution structure is indirectly coupled to the substrate.

According to an aspect, the second metal layer is on a surface of the integrated device.

According to an aspect, the method further includes providing a first die such that the first die is coupled to the substrate.

According to an aspect, the redistribution structure is coupled to the first die and the substrate.

According to an aspect, the integrated device is one of at least a die, die package, and/or an integrated package device.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., die, die package, integrated package device) that includes a substrate, several metal layers coupled to the substrate, several dielectric layers coupled to the substrate, and a redistribution portion coupled to one of the metal layers. The redistribution structure (e.g., redistribution portion) includes a first metal redistribution layer, an insulation layer coupled to the first metal redistribution layer, and a second metal redistribution layer coupled to the insulation layer. The first metal redistribution layer, the insulation layer, and the second metal redistribution layer are configured to operate as a capacitor in the integrated device. In some implementations, the insulation layer is a high k dielectric layer. In some implementations, the capacitor is a metal-insulator-metal (MIM) capacitor. In some implementations, the capacitor is a decoupling capacitor for a power distribution network (PDN) for the integrated device. In some implementations, the capacitor may be implemented in an analog circuit. In some implementations, the capacitor may be implemented in resistor-capacitor (RC) filters (e.g., low pass filters, mid-band filters, high pass filters). In some implementations, the capacitor may be implemented in programmable filters. In some implementations, the capacitor may be implemented in oscillator circuits and input/output (I/O) decoupling for high frequency response. In some implementations, the capacitor is implemented in the redistribution layers of a die, a die package, and/or an integrated device package.

Exemplary Capacitor in an Integrated Device

Figure 1:
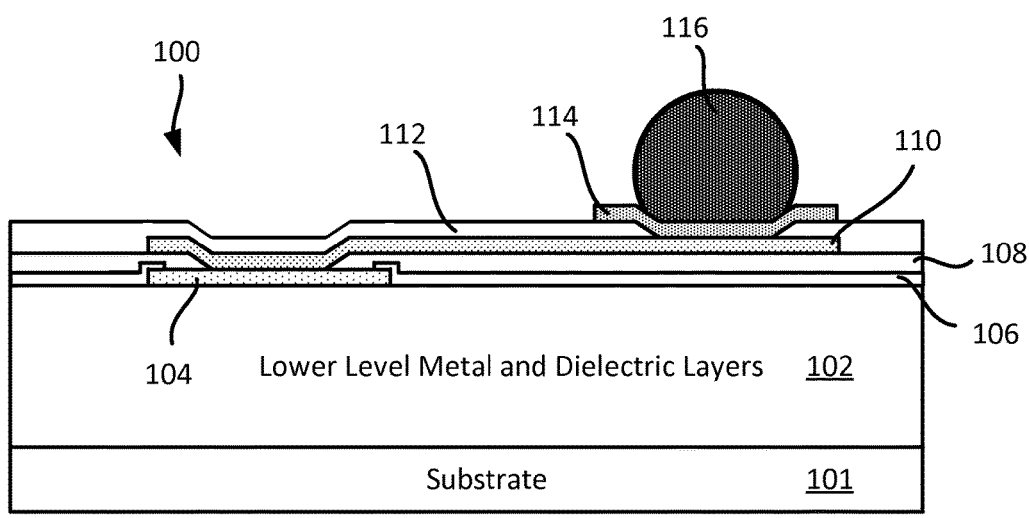
FIG. 1 illustrates a profile view of a conventional die.
Figure 2:
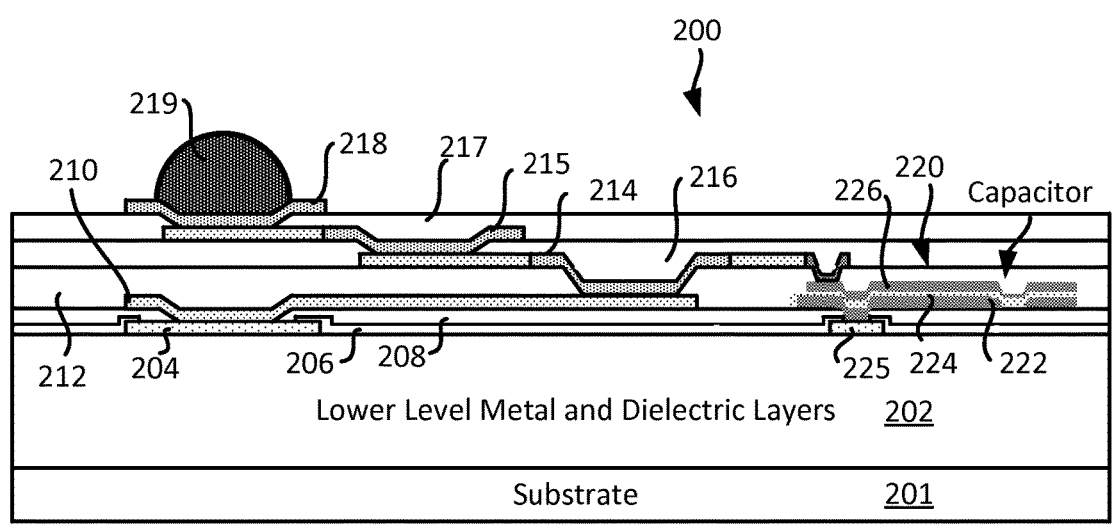
FIG. 2 illustrates an example of an integrated device that includes a capacitor in a redistribution portion of the integrated device.

FIG. 2 conceptually illustrates an example of a side view of a capacitor in an integrated device (e.g., semiconductor device, die, die package, integrated device package). Specifically, FIG. 2 illustrates an integrated device 200 that includes a substrate 201, several lower level metal layers and dielectric layers 202, a first pad 204, a second pad 225, a passivation layer 206, a first insulation layer 208 (e.g., first dielectric layer), a first redistribution layer 210, a second insulation layer 212 (e.g., second dielectric layer), a second redistribution layer 214, a third insulation layer 216 (e.g., third dielectric layer), a third redistribution layer 215 and a fourth insulation layer 217 (e.g., fourth dielectric layer), and an under bump metallization (UBM) layer 218. The UBM layer 218 is optional in some implementations.

In some implementations, the pad 204, the passivation layer 206, the first insulation layer 208 (e.g., first dielectric layer), the first redistribution layer 210, the second insulation layer 212 (e.g., second dielectric layer), the second redistribution layer 214, the third insulation layer 216 (e.g., third dielectric layer), the third redistribution layer 215, the fourth insulation layer 217, and/or the under bump metallization (UBM) layer 218 are part of a redistribution structure (e.g., redistribution portion) of the integrated device 200.

FIG. 2 also illustrates a solder ball 219 coupled to the UBM layer 218. The first and second redistribution layers 210 and 214 may be conductive layers (e.g., metal layer, copper layer) in some implementations. The substrate 201 may be one of at least silicon, glass, ceramic, and/or dielectric. The substrate 201 may include active devices (e.g., active transistor devices). In some implementations, the metal layers of the lower level metal layers and dielectric layers 202 are configured to provide one or more electrical paths (e.g., routes, interconnects) to one or more circuit elements and/or active transistors devices (not shown) in the integrated device 200.

FIG. 2 also illustrates that the integrated device 200 includes a capacitor 220. In some implementations, the capacitor 220 is metal-insulator-metal (MIM) capacitor. In some implementations, the capacitor 220 is a decoupling capacitor for a power distribution network (PDN) for the integrated device 200.

In some implementations, the capacitor 220 may be implemented in an analog circuit. In some implementations, the capacitor 220 may be implemented in resistor-capacitor (RC) filters (e.g., low pass filters, mid-band filters, high pass filters). In some implementations, the capacitor 220 may be implemented in programmable filters. In some implementations, the capacitor 220 may be implemented in oscillator circuits and input/output (I/O) decoupling for high frequency response.

As shown in FIG. 2 the capacitor 220 includes a first interconnect 222, an insulation layer 224, and a second interconnect 226. In some implementations, the first interconnect 222, the insulation layer 224, and the second interconnect 226 are configured to operate as a capacitor. In some implementations, the first interconnect 222 is a bottom electrode for the capacitor, the second interconnect 226 is a top electrode for the capacitor. Different implementations may use different materials for the first interconnect 222, the insulation layer 224, and the second interconnect 226. In some implementations, the first interconnect 222 and the second interconnect 226 are metal layers. In some implementations, both the first interconnect 222 and the second interconnect 226 are redistribution layers. In some implementation, the first interconnect 222 is a redistribution layer and the second interconnect 226 is an under bump metallization (UBM) layer. In some implementations, the insulation layer 224 is a dielectric layer (e.g., high k dielectric layer). In some implementations, a high k dielectric layer includes a dielectric with a dielectric constant equal or greater than 5 (e.g., 5-80 range). In some implementations, the insulation layer 224 is a different dielectric layer than the dielectrics 208, 212 and/or 216. Several examples of materials, shapes and configurations of a capacitor are further described in detail in FIGS. 4-8.

It should be noted that the shape and configuration of the capacitor 220 in FIG. 2 is merely exemplary. In some implementations, a capacitor may have different shapes (e.g., length) and/or configurations. For example, in some implementations, the first interconnect 222 (e.g., bottom electrode) may be smaller (e.g., shorter) than the insulation layer 224 and/or the second interconnect 226 (e.g., top electrode). In some implementations, the insulation layer 224 may be smaller (e.g., shorter) than the second interconnect 226.

The first interconnect 222 (e.g., bottom electrode) and/or second interconnect 226 (e.g., top electrode) may be electrically coupled to different portions of the integrated device 200. In some implementations, the first interconnect 222 and/or the second interconnect 226 may be coupled to the lower level metal and dielectric layers 202, pads (e.g., pad 204, pad 225), and/or redistribution layers (e.g., redistribution layers 210 and 214). As shown in FIG. 2, the first interconnect 222 is coupled to the second pad 225. The second interconnect 226 is coupled to the first pad 204 through the redistribution layers 214 and 210. The electrical coupling of the capacitor 220 in FIG. 2 is thus merely exemplary. In different implementations, the capacitor 220 may be electrically coupled to the solder ball 219 and/or active devices (e.g., active transistors) in the substrate 201.

FIG. 2 illustrates that the capacitor 220 is positioned and located in the redistribution structure (e.g., in the redistribution layers) of the integrated device 200 (e.g., outside of the lower level metal layers and dielectric layers 202). In some implementations, the first interconnect 222 is part of the first redistribution layer 210. In some implementations, the second interconnect 226 is part of the second redistribution layer 214. However, it should be noted that the position and/or the location of the capacitor 220 in the integrated device 200 shown in FIG. 2 is merely exemplary and the capacitor 220 may be positioned and/or located in different portions of the redistribution structure (e.g., redistribution layers) of the integrated device 200. For example, in some implementations, there may be more than one redistribution layer (e.g., first redistribution layer, second redistribution layer, third redistribution layer). In such instances, the capacitor may be positioned and/or located in any of the redistribution layers or metal layers in between the redistribution layers. Moreover, in some implementations, there may be more than one capacitor, or there may be different types and/or combinations of capacitors in the redistribution layers of the integrated device 200.

In some implementations, the capacitor may be positioned and/or located differently in and/or on the dielectric layer of an integrated device. For example, in some implementations, part of the capacitor may be on the surface of the dielectric layer (and/or upper level of the redistribution portion) of an integrated device. In addition, different configurations of a capacitor may be implemented in the redistribution portion.

Figure 3:
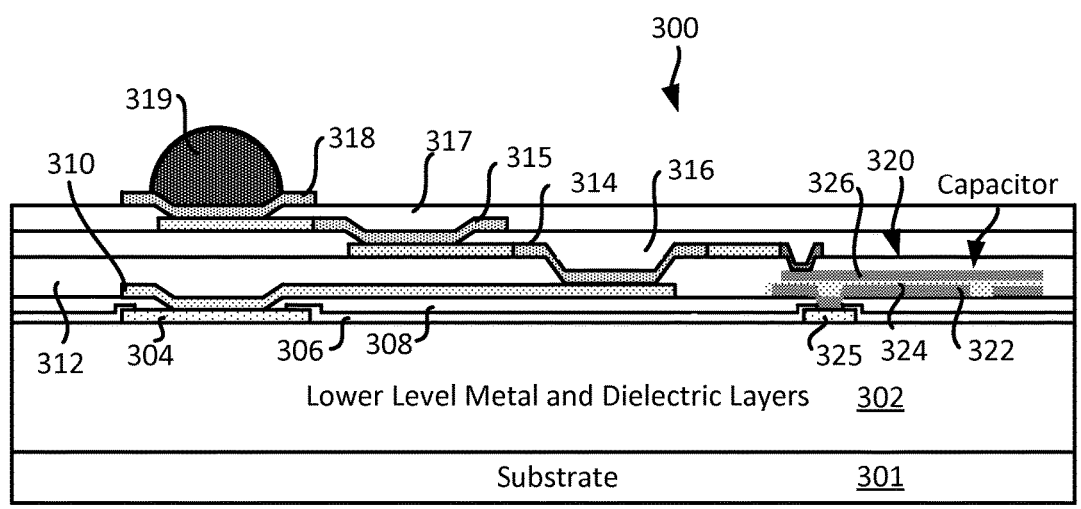
FIG. 3 illustrates another example of an integrated device that includes another capacitor in a redistribution portion of the integrated device.

FIG. 3 conceptually illustrates an example of a side view of a capacitor in an integrated device (e.g., semiconductor device, die, die package, integrated device package), where a portion of the capacitor is planar. Specifically, FIG. 3 illustrates a integrated device 300 (e.g., die, die package) that includes a substrate 301, several lower level metal layers and dielectric layers 302, a first pad 304, a second pad 325, a passivation layer 306, a first insulation layer 308 (e.g., first dielectric layer), a first redistribution layer 310, a second insulation layer 312 (e.g., second dielectric layer), a second redistribution layer 314, a third insulation layer 316 (e.g., third dielectric layer), a third redistribution layer 315, a fourth insulation layer 317 (e.g., fourth dielectric layer), and an under bump metallization (UBM) layer 318. In some implementations, the pad 304, the passivation layer 306, the first insulation layer 308 (e.g., first dielectric layer), the first redistribution layer 310, the second insulation layer 312 (e.g., second dielectric layer), the second redistribution layer 314, the third insulation layer 316 (e.g., third dielectric layer), the third redistribution layer 315, the fourth insulation layer 317, and the under bump metallization (UBM) layer 318 are part of a redistribution structure (e.g., redistribution portion) of the integrated device 300.

FIG. 3 also illustrates a solder ball 319 coupled to the UBM layer 318. The first and second redistribution layers 310 and 314 may be conductive layers (e.g., metal layer, copper layer) in some implementations. The substrate 301 may be one of at least silicon, glass, ceramic, and/or dielectric. In some implementations, the metal layers of the lower level metal layers and dielectric layers 302 are configured to provide one or more electrical paths (e.g., routes, interconnects) to one or more circuit elements (not shown) in the integrated device 300.

FIG. 3 also illustrates the integrated device 300 includes a capacitor 320. In some implementations, a portion of the capacitor 320 may be on the surface of the integrated device 300 (e.g., on surface of the dielectric and/or insulation layer 316). In some implementations, the capacitor 320 is a metal-insulator-metal (MIM) capacitor. In some implementations, the capacitor 320 is a decoupling capacitor for a power distribution network (PDN) for the integrated device 300.

In some implementations, the capacitor 320 may be implemented in an analog circuit. In some implementations, the capacitor 320 may be implemented in resistor-capacitor (RC) filters (e.g., low pass filters, mid-band filters, high pass filters). In some implementations, the capacitor 320 may be implemented in programmable filters. In some implementations, the capacitor 320 may be implemented in oscillator circuits and input/output (I/O) decoupling for high frequency response.

As shown in FIG. 3 the capacitor 320 includes a first interconnect 322, an insulation layer 324, a second interconnect 326. In some implementations, the first interconnect 322, the insulation layer 324, and the second interconnect 326 are configured to operate as a capacitor. In some implementations, the first interconnect 322 is a bottom electrode for the capacitor, the second interconnect 326 is a top electrode for the capacitor. Different implementations may use different materials for the first interconnect 322, the insulation layer 324, and the second interconnect 326. In some implementations, the first interconnect 322 and the second interconnect 326 are metal layers. In some implementation, the first interconnect 322 is a redistribution layer and the second interconnect 326 is an under bump metallization (UBM) layer. In some implementations, the insulation layer 324 is a dielectric layer (e.g., high k dielectric layer). In some implementations, a high k dielectric includes a dielectric with a dielectric constant equal or greater than 5 (e.g., 5-80 range). In some implementations, the insulation layer 324 is a different dielectric layer than the dielectrics 308, 312 or 316. Several examples of materials, shapes and configurations of a capacitor are further described in detail in FIGS. 4-8.

It should be noted that the shape and configuration of the capacitor 320 in FIG. 3 is merely exemplary. In some implementations, a capacitor may have different shapes (e.g., length) and/or configurations. For example, in some implementations, the first interconnect 322 (e.g., bottom electrode) may be smaller (e.g., shorter) than the insulation layer 324 and/or the second interconnect 326 (e.g., top electrode). In some implementations, the insulation layer 324 may be smaller (e.g., shorter) than the second interconnect 326. The first interconnect 322 (e.g., bottom electrode) and/or second interconnect 326 (e.g., top electrode) may be electrically coupled to different portions of the integrated device 300. In some implementations, the first interconnect 322 and/or the second interconnect 326 may be coupled to the lower level metal and dielectric layers 302, pads (e.g., pad 304, pad 325), and/or redistribution layers (e.g., redistribution layers 310 and 314). As shown in FIG. 3, the first interconnect 322 is coupled to the second pad 325. The second interconnect 326 is coupled to the first pad 304 through the redistribution layers 314 and 310. The electrical coupling of the capacitor 320 in FIG. 3 is thus merely exemplary. In different implementations, the capacitor 320 may be electrically coupled to the solder ball 319 and/or active devices (e.g., active transistors) in the substrate 301.

FIG. 3 illustrates that the capacitor 320 is positioned and located in the redistribution structure (e.g., in the redistribution layers) of the integrated device 300 (e.g., outside of the lower level metal layers and dielectric layers 302). In some implementations, the second interconnect 326 is part of the first redistribution layer 310. However, it should be noted that the position and/or the location of the capacitor 320 in the integrated device 300 shown in FIG. 3 is merely exemplary and the capacitor 320 may be positioned and/or located in different portions of the redistribution structure (e.g., redistribution layers) of the integrated device 300. For example, in some implementations, there may be more than two redistribution layers (e.g., first redistribution layer, second redistribution layer, third redistribution layer). In such instances, the capacitor may be positioned and/or located in any of the redistribution layers. Moreover, in some implementations, there may be more than one capacitor, or there may be different types and/or combinations of capacitors in the redistribution layers of the integrated device 300.

Having described an example of a capacitor that is provided in an integrated device that includes one die, examples of shapes and/or configuration of capacitors will now be described below.

Exemplary Capacitor Shapes and/or Configurations

FIGS. 4-8 illustrate various examples of different configurations of capacitors that may be implemented in the present disclosure. In some implementations, the capacitors of FIGS. 4-8 are metal-insulator-metal (MIM) capacitors.

Figure 4:
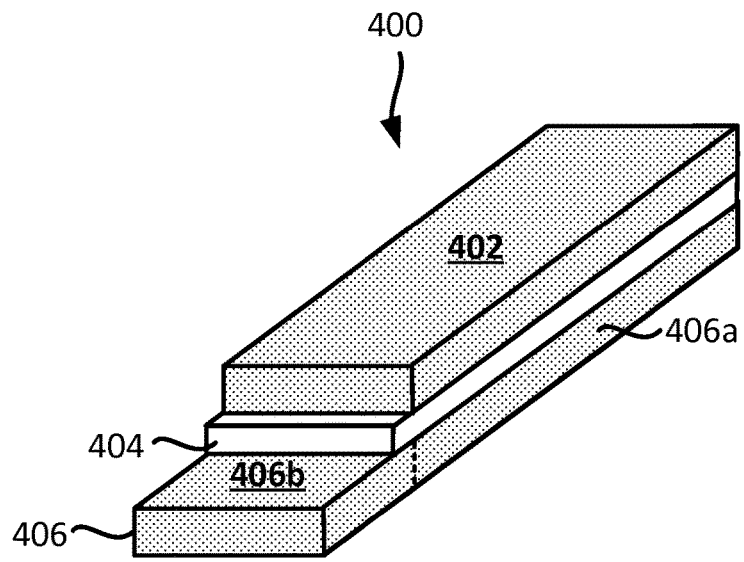
FIG. 4 illustrates an example of an abstract representation of a capacitor.
Figure 5:
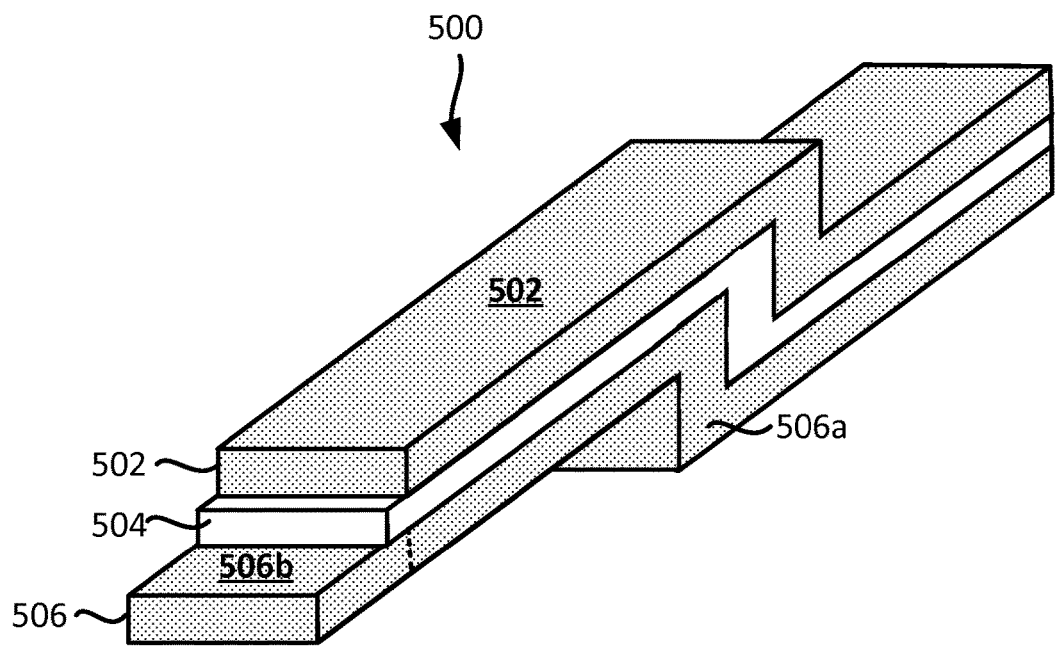
FIG. 5 illustrates another example of an abstract representation of a capacitor.
Figure 6:
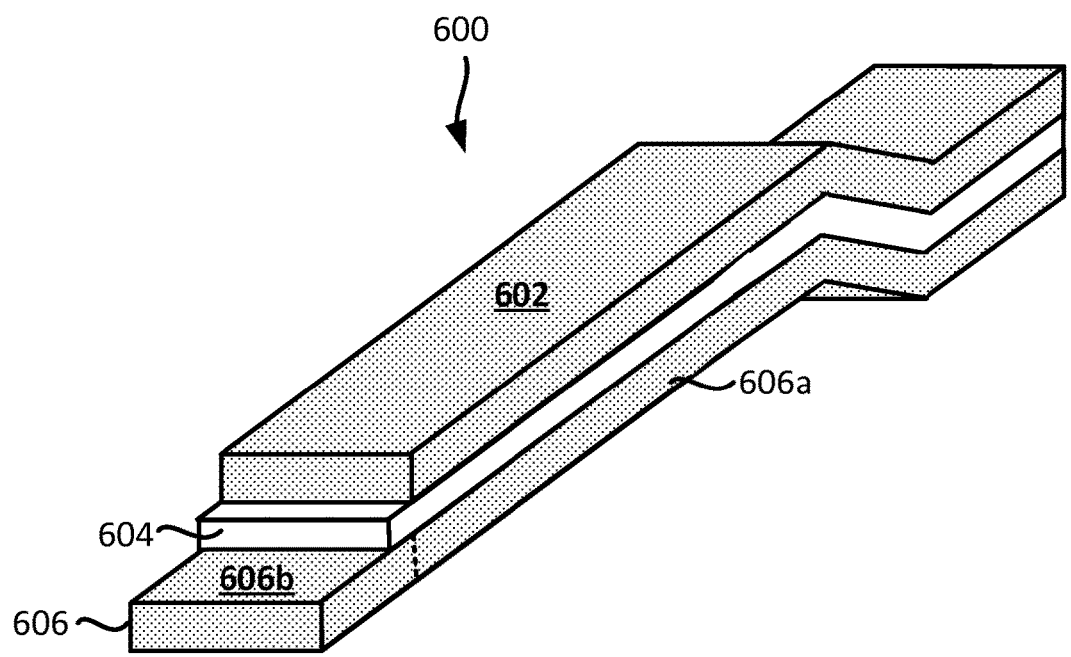
FIG. 6 illustrates another example of an abstract representation of a capacitor.

FIGS. 4-6 illustrate angled views of various different configurations of a capacitor that may be implemented in the present disclosure.

FIG. 4 conceptually illustrates an angled view of an example of a capacitor 400. In some implementations, the capacitor 220 of FIG. 2 and/or the capacitor 320 of FIG. 3 may be configured to have a similar configuration as the capacitor 400 of FIG. 4. However, it should be noted that the capacitor 400 may be applicable to any of the capacitors described in the present disclosure.

As shown in FIG. 4, the capacitor 400 includes a first set of interconnects 402, a set of insulation layers 404, and a second set of interconnects 406. In some implementations, the first set of interconnects 402, the set of insulation layers 404, and the second set of interconnects 406 are configured to operate as a capacitor. In some implementations, the capacitor 400 is metal-insulator-metal (MIM) capacitor. In some implementations, the capacitor 400 is a decoupling capacitor for a power distribution network (PDN) for an integrated device (e.g., semiconductor device, integrated package, die package, die).

In some implementations, the capacitor 400 may be implemented in an analog circuit. In some implementations, the capacitor 400 may be implemented in resistor-capacitor (RC) filters (e.g., low pass filters, mid-band filters, high pass filters). In some implementations, the capacitor 400 may be implemented in programmable filters. In some implementations, the capacitor 400 may be implemented in oscillator circuits and input/output (I/O) decoupling for high frequency response.

In some implementations, the first set of interconnects 402 are on a first plane (e.g., top plane, top metal layer). In some implementations, the first set of interconnects 402 is a first planar set of interconnects. In some implementations, the second set of interconnects 406 are on a second plane (e.g., bottom plane, bottom metal layer). In some implementations, the second set of interconnects 406 is a second planar set of interconnects. The second set of interconnects 406 includes a second overlapping interconnect 406a and a second non-overlapping interconnect 406b. In some implementations, the set of insulation layers 404 are on a third plane (e.g., middle plane). In some implementations, the set of insulations layers 404 includes an overlapping insulation layer.

As shown in FIG. 4, the first set of interconnects 402 is coupled to the set of insulation layers 404. FIG. 4 also shows that the second set of interconnects 406 is coupled to the set of insulation layers 404. Specifically, the second overlapping interconnect 406a is coupled to the overlapping insulation layer 404. In some implementations, as shown in FIG. 4, the first interconnect 402, the overlapping insulation layer 404, and the second overlapping interconnect 406a are coupled such that they vertically overlap with each other. However, in some implementations, the first interconnect 402, the overlapping insulation layer 404, and the second overlapping interconnect 406a are coupled such that they horizontally overlap with each other. In some implementations, the insulation layer 404 is equal or greater (e.g., longer) than the first interconnect 402.

In some implementations, the capacitor 400 may be provided in an integrated device. In particular, in some implementations, the capacitor 400 may be provided in a redistribution structure (e.g., one or more redistribution layers) of an integrated device, including any of the integrated devices described in the present disclosure. For example, the capacitor 400 may be provided in the redistribution layers 210 and 214 of the integrated device 200.

It should be noted that the capacitor 400 shown in FIG. 4 is an abstract representation of a capacitor. In some implementations, a capacitor in an integrated device (e.g., integrated device 200) may look differently than what is depicted in FIG. 4.

FIG. 5 conceptually illustrates an angled view of an example of a capacitor 500. In some implementations, the capacitor 220 of FIG. 2 and/or the capacitor 320 of FIG. 3 may be configured to have a similar configuration as the capacitor 500 of FIG. 5. However, it should be noted that the capacitor 500 may be applicable to any of the capacitors described in the present disclosure.

As shown in FIG. 5, the capacitor 500 includes a first set of interconnects 502, a set of insulation layers 504, and a second set of interconnects 506. In some implementations, the first set of interconnects 502, the set of insulation layers 504, and the second set of interconnects 506 are configured to operate as a capacitor. In some implementations, the capacitor 500 is metal-insulator-metal (MIM) capacitor. In some implementations, the capacitor 500 is a decoupling capacitor for a power distribution network (PDN) for an integrated device (e.g., semiconductor device, integrated package, die package, die).

In some implementations, the capacitor 500 may be implemented in an analog circuit. In some implementations, the capacitor 500 may be implemented in resistor-capacitor (RC) filters (e.g., low pass filters, mid-band filters, high pass filters). In some implementations, the capacitor 500 may be implemented in programmable filters. In some implementations, the capacitor 500 may be implemented in oscillator circuits and input/output (I/O) decoupling for high frequency response.

In some implementations, the first set of interconnects 502 include planar interconnects and non-planar interconnects (e.g., vertical interconnects, via). In some implementations, the first set of interconnects 502 includes a first planar set of interconnects and a second planar set of interconnects. In some implementations, the second set of interconnects 506 include planar interconnects and non-planar interconnects (e.g., vertical interconnects, via). In some implementations, the second set of interconnects 506 includes a third planar set of interconnects and a fourth planar set of interconnects. The second set of interconnects 506 includes a second overlapping interconnect 506a and a second non-overlapping interconnect 506b. In some implementations, the set of insulation layers 504 includes a planar insulation layer and a non-planar insulation layer. In some implementations, the set of insulations layers 504 includes an overlapping insulation layer.

As shown in FIG. 5, the first set of interconnects 502 is coupled to the set of insulation layers 504. FIG. 5 also shows that the second set of interconnects 506 is coupled to the set of insulation layers 504. Specifically, the second overlapping interconnect 506a is coupled to the overlapping insulation layer 504. In some implementations, as shown in FIG. 5, the first interconnect 502, the overlapping insulation layer 504, and the second overlapping interconnect 506a are coupled such that they vertically overlap with each other. In some implementations, the first interconnect 502, the overlapping insulation layer 504, and the second overlapping interconnect 506a are coupled such that they horizontally overlap with each other. In some implementations, the insulation layer 504 is equal or greater (e.g., longer) than the first interconnect 502.

In some implementations, the capacitor 500 may be provided in an integrated device. In particular, in some implementations, the capacitor 500 may be provided in a redistribution structure (e.g., one or more redistribution layers) of an integrated device, including any of the integrated devices described in the present disclosure. For example, the capacitor 500 may be provided in the redistribution layers 210 and 214 of the integrated device 200.

It should be noted that the capacitor 500 shown in FIG. 5 is an abstract representation of a capacitor. In some implementations, a capacitor in an integrated device (e.g., integrated device 200) may look differently than what is depicted in FIG. 5.

FIG. 6 conceptually illustrates an angled view of an example of a capacitor 600. In some implementations, the capacitor 220 of FIG. 2 and/or the capacitor 320 of FIG. 3 may be configured to have a similar configuration as the capacitor 600 of FIG. 6. However, it should be noted that the capacitor 600 may be applicable to any of the capacitors described in the present disclosure.

As shown in FIG. 6, the capacitor 600 includes a first set of interconnects 602, a set of insulation layers 604, and a second set of interconnects 606. In some implementations, the first set of interconnects 602, the set of insulation layers 604, and the second set of interconnects 606 are configured to operate as a capacitor. In some implementations, the capacitor 600 is metal-insulator-metal (MIM) capacitor. In some implementations, the capacitor 600 is a decoupling capacitor for a power distribution network (PDN) for an integrated device (e.g., semiconductor device, integrated package, die package, die).

In some implementations, the capacitor 600 may be implemented in an analog circuit. In some implementations, the capacitor 600 may be implemented in resistor-capacitor (RC) filters (e.g., low pass filters, mid-band filters, high pass filters). In some implementations, the capacitor 600 may be implemented in programmable filters. In some implementations, the capacitor 600 may be implemented in oscillator circuits and input/output (I/O) decoupling for high frequency response.

In some implementations, the first set of interconnects 602 include planar interconnects and non-planar interconnects (e.g., angled interconnects, diagonal interconnects, via). In some implementations, the first set of interconnects 602 includes a first planar set of interconnects and a second planar set of interconnects. In some implementations, the second set of interconnects 606 include planar interconnects and non-planar interconnects (e.g., vertical interconnects, via). In some implementations, the second set of interconnects 606 includes a third planar set of interconnects and a fourth planar set of interconnects. The second set of interconnects 606 includes a second overlapping interconnect 606a and a second non-overlapping interconnect 606b. In some implementations, the set of insulation layers 604 includes a planar insulation layer and a non-planar insulation layer. In some implementations, the set of insulations layers 604 includes an overlapping insulation layer.

As shown in FIG. 6, the first set of interconnects 602 is coupled to the set of insulation layers 604. FIG. 6 also shows that the second set of interconnects 606 is coupled to the set of insulation layers 604. Specifically, the second overlapping interconnect 606a is coupled to the overlapping insulation layer 604. In some implementations, as shown in FIG. 6, the first interconnect 602, the overlapping insulation layer 604, and the second overlapping interconnect 606a are coupled such that they vertically overlap with each other. In some implementations, the first interconnect 602, the overlapping insulation layer 604, and the second overlapping interconnect 606a are coupled such that they horizontally overlap with each other. In some implementations, the insulation layer 604 is equal or greater (e.g., longer) than the first interconnect 602.

In some implementations, the capacitor 600 may be provided in an integrated device. In particular, in some implementations, the capacitor 600 may be provided in a redistribution structure (e.g., one or more redistribution layers) of an integrated device, including any of the integrated devices described in the present disclosure. For example, the capacitor 600 may be provided in the redistribution layers 210 and 214 of the integrated device 200.

It should be noted that the capacitor 600 shown in FIG. 6 is an abstract representation of a capacitor. In some implementations, a capacitor in an integrated device (e.g., integrated device 200) may look different than what is depicted in FIG. 6.

In some implementations, a capacitor may be a combination of the capacitors of FIGS. 4, 5, and/or 6.

Figure 7:
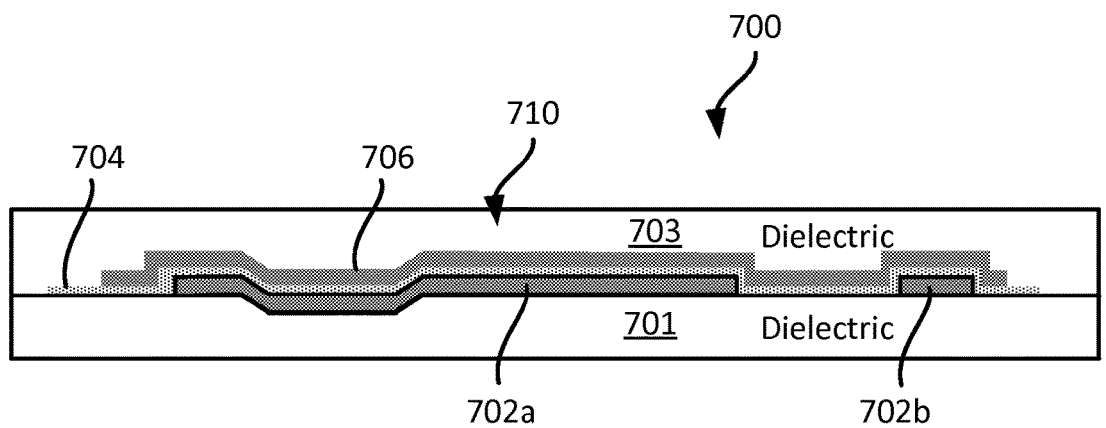
FIG. 7 illustrates an example of a capacitor where a top electrode of the capacitor conforms with a bottom electrode of the capacitor.
Figure 8:
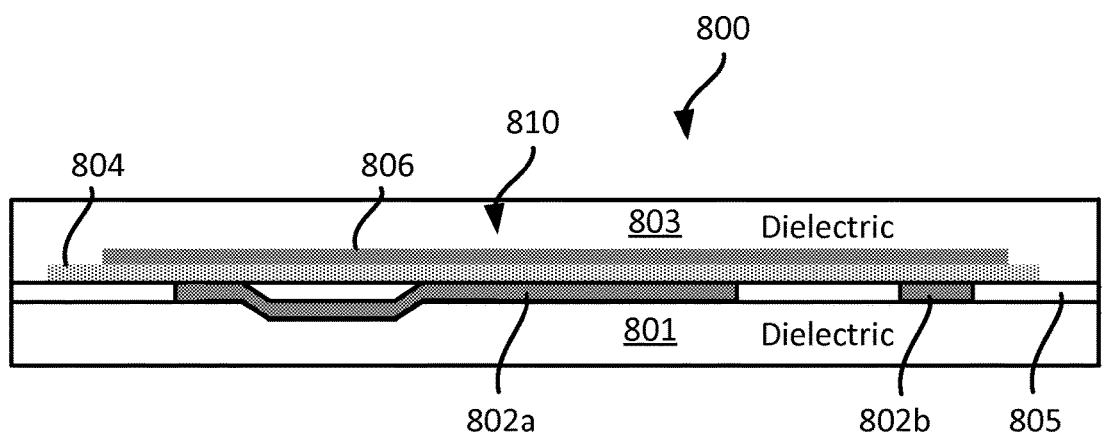
FIG. 8 illustrates an example of a capacitor where a planar top electrode of the capacitor with a non-planar bottom electrode of the capacitor.

FIGS. 7-8 illustrate more examples of capacitors and/or capacitor structures that may be implemented in a redistribution portion of an integrated device (e.g., semiconductor device, die, die package, integrated device package).

FIG. 7 illustrates an integrated device 700 that includes a first dielectric layer 701, a second dielectric layer 703, and a capacitor 710. In some implementations, the first dielectric layer 701 and the second dielectric layer 703 are the same dielectric layer. In some implementations, the first dielectric layer 701 and the second dielectric layer 703 are made of the same material. In some implementations, the first dielectric layer 701 and the second dielectric layer 703 are dielectric layers in a redistribution portion of an integrated device (e.g., die, die package, integrated package device).

The capacitor 710 includes a first set of interconnects 702, an insulation layer 704 (e.g., high k dielectric), and a second set of interconnects 706. In some implementations, a high k dielectric includes a, dielectric with a dielectric constant equal or greater than 5 (e.g., 5-80 range). The first set of interconnects 702 includes interconnect 702a and interconnect 702b. In some implementations, the first set of interconnects 702 and the second set of interconnects 706 are redistribution metal layers in a redistribution portion of an integrated device (e.g., die, die package, integrated package device). In some implementations, the first set of interconnects 702 is a bottom electrode of the capacitor 710, and the second set of interconnects 706 is a top electrode of the capacitor 710. In some implementations, the dimension (e.g., length) of the insulation layer 704 is greater than the dimension (e.g., length) of the first set of interconnects 702 and/or the second set of interconnects 706.

As shown in FIG. 7, the capacitor 710 is located in the first dielectric layer 701 and the second dielectric layer 703. Specifically, the first set of interconnects 702, the insulation layer 704, and the second set of interconnects 706 are located in the first dielectric layer 701 and the second dielectric layer 703. FIG. 7 illustrates that the insulation layer 704 and the second set of interconnects 706 are formed on the first set of interconnects 702 such that the insulation layer 704 and the second set of interconnects 706 take the shape and/or form of the first set of interconnects 702. However, different implementations may have different shapes and forms. Thus, in this example, when the first set of interconnects 702 is non-planar (e.g., not substantially flat) across its cross section, then the insulation layer 704 and the second set of interconnects 706 are also non-planar. In another example, when the first set of interconnects 702 is planar (e.g., substantially flat), then the insulation layer 704 and the second set of interconnects 706 would also be planar.

FIG. 8 illustrates an integrated device 800 that includes a first dielectric layer 801, a second dielectric layer 803, a third dielectric layer 805, and a capacitor 810. In some implementations, the first dielectric layer 801, the second dielectric layer 803, and/or the third dielectric layer 805 are the same dielectric layer. In some implementations, the first dielectric layer 801 the second dielectric layer 803 and/or the third dielectric layer 805 are made of the same material. In some implementations, the first dielectric layer 801, the second dielectric layer 803, and/or the third dielectric layer 805 are dielectric layers in a redistribution portion of an integrated device (e.g., die, die package, integrated package device).

The capacitor 810 includes a first set of interconnects 802, an insulation layer 804 (e.g., high k dielectric), and a second set of interconnects 806. In some implementations, a high k dielectric includes a, dielectric with a dielectric constant equal or greater than 5 (e.g., 5-80 range). The first set of interconnects 802 includes interconnect 802a and interconnect 802b. In some implementations, the first set of interconnects 802 and the second set of interconnects 806 are redistribution metal layers in a redistribution portion of an integrated device (e.g., die, die package, integrated package device). FIG. 8 illustrates that the third dielectric layer 805 is positioned between the interconnects 802a and 802b. In some implementations, at least a portion of the third dielectric layer 805 is part of the capacitor 810. In some implementations, the first set of interconnects 802 is a bottom electrode of the capacitor, and the second set of interconnects 806 is a top electrode of the capacitor. In some implementations, the dimension (e.g., length) of the insulation layer 804 is greater than the dimension (e.g., length) of the first set of interconnects 802 and/or the second set of interconnects 806.

As shown in FIG. 8, the capacitor 810 is located in the first dielectric layer 801, the second dielectric layer 803, and/or the third dielectric layer 805. Specifically, the first set of interconnects 802, the insulation layer 804, and the second set of interconnects 806 are located in the first dielectric layer 801, the second dielectric layer 803 and/or the third dielectric layer 805.

FIG. 8 illustrates that the insulation layer 804 and the second set of interconnects 806 are formed on the first set of interconnects 802 such that the insulation layer 804 and the second set of interconnects 806 take the shape and/or form of the first set of interconnects 702 and a portion of the third dielectric layer 805. In some implementations, the insulation layer 804 and the second set of interconnects 806 have a planar surface (e.g., flat surface), even if the first set of interconnects 802 does not have an planar surface (e.g., flat surface) across a cross section of the first set of interconnects 802. Thus, in this example, when the first set of interconnects 802 is non-planar (e.g., not substantially flat) across its cross section, the insulation layer 804 and the second set of interconnects 806 can still be planar (e.g., substantially flat), due to the third dielectric layer 805, which can act as base for the insulation layer 804.

Exemplary Capacitor in an Integrated Device

In some implementations, a capacitor may be provided in an integrated device (e.g., semiconductor device) that includes more than one die.

Figure 9:
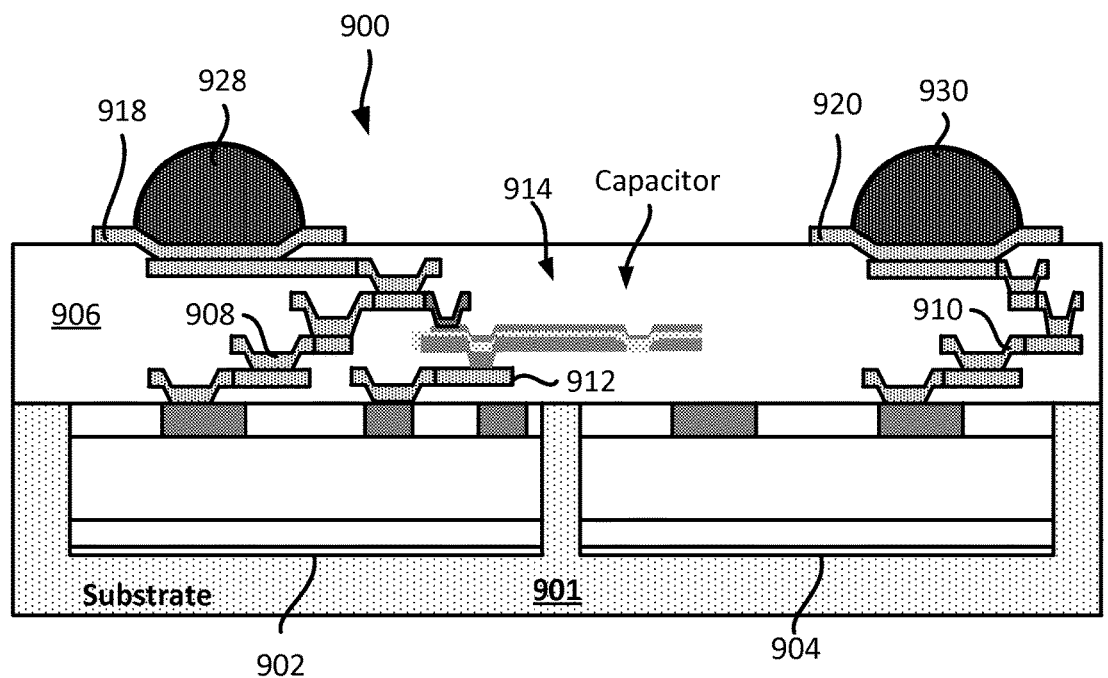
FIG. 9 illustrates an example of a package that includes a capacitor in a redistribution portion of the package.

FIG. 9 conceptually illustrates an integrated device 900 that includes several dies. As shown in FIG. 9, the integrated device 900 (e.g., semiconductor device, package) includes a substrate 901, a first integrated device 902 (e.g., first die), a second integrated device 904 (e.g., second die), a dielectric layer 906, a first set of redistribution layers 908, a second set of redistribution layers 910, a third set of redistribution layers 912, a capacitor 914, a first under bump metallization (UBM) layer 918, a second under bump metallization (UBM) layer 920, a first solder ball 928, and a second solder ball 930. In some implementations, the dielectric layer 906, the first set of redistribution layers 908, the second set of redistribution layers 910, the capacitor 914, the first under bump metallization (UBM) layer 918, and the second under bump metallization (UBM) layer 920 are part of a redistribution structure (e.g., redistribution portion) of the integrated device 900.

The shape and configuration of the capacitor 914 in FIG. 9 is merely exemplary. Different implementations may have different shapes and configurations for the capacitor 914. For example, the capacitor 914 may have the shape and configuration of any of the capacitors previously described in FIGS. 4-8.

The electrical coupling of the capacitor 914 in FIG. 9 is merely exemplary. In different implementations, the capacitor 914 may be electrically coupled to the solder ball 928 and/or the dies (e.g., dies 902, 904) using different electrical paths (e.g., different redistribution layers). For example, a first electrode (e.g., bottom electrode) of the capacitor 914 may be coupled to the third set of redistribution layers 912, and a second electrode (e.g., top electrode) of the capacitor 914 may be coupled to the first set of redistribution layers 908. At least some of the first set of redistribution layers may be coupled to the die(s) and/or solder balls of the integrated package.

The substrate 901 may include one of at least silicon, glass, ceramic, and/or dielectric. The first and second integrated devices 902 & 904 (e.g., first and second dies) are located (e.g., embedded) in the substrate 901. In some implementations, the first and second integrated devices 902 & 904 are located in cavities and/or trenches of the substrate 901. An example of a die is further described in FIG. 10.

The first integrated device 902 (e.g., first die) is coupled to the first set of redistribution layers 908. The first set of redistribution layers 908 may include one or more interconnects (e.g., metal layers) and/or one or more vias. The first set of redistribution layers 908 is also coupled to the first UBM layer 918. The first UBM layer 918 is coupled to the first solder ball 928.

The second integrated device 904 (e.g., second die) is coupled to the second set of redistribution layers 910. The second set of redistribution layers 910 may include one or more interconnects (e.g., metal layers) and/or one or more vias. The second set of redistribution layers 910 is also coupled to the second UBM layer 920. The second UBM layer 920 is coupled to the second solder ball 930.

FIG. 9 illustrates the capacitor 914 is electrically coupled to the first die 902. Specifically, FIG. 9 illustrates a bottom interconnect (e.g., bottom electrode) of the capacitor 914 is coupled to the third set of redistribution layers 912, which is coupled to a pad of the first die 902. FIG. 9 also illustrates a top interconnect (e.g., top electrode) of the capacitor 914 is coupled to the first set of redistribution layers 908, which is coupled to a pad of the first die 902.

In some implementations, the first integrated device 902 may be electrically coupled to the second integrated device 904 through a fourth set of redistribution layers (not shown) in the redistribution portion of the integrated device. The fourth set of redistribution layers may include one or more interconnects (e.g., metal layers) and/or one or more vias.

The fourth set of redistribution layers may be similar to the first and/or second distribution layers 908 & 910.

The first redistribution layers 908, the second redistribution layers 910, and the third redistribution layers 912 are located in the dielectric layer 906. In some implementations, the dielectric layer 906 includes several dielectric layers.

As described above, the integrated device 900 includes a capacitor 914. In some implementations, the capacitor 914 is metal-insulator-metal (MIM) capacitor. In some implementations, the capacitor 914 is a decoupling capacitor for a power distribution network (PDN) for the integrated device 900. In some implementations, the capacitor 914 is coupled to the first set of redistribution layers 908. The capacitor 914 is positioned and/or located in the dielectric layer 906. In some implementations, the capacitor 914 includes several interconnects (e.g., redistribution layers, UBM layers, vias) and one or more insulation layers. In some implementations, the insulation layer includes a high k dielectric layer (e.g., dielectric with a dielectric constant equal or greater than 5 (e.g., 5-80 range)). In some implementations, the insulation layer is different than the dielectric layer 906. In some implementations, the capacitor 914 may have a shape and configuration that is similar to the capacitors shown in FIGS. 4-8. A more specific example of a capacitor is further described in FIG. 11.

As mentioned above, the first set of redistribution layers 908 is coupled to the first integrated device 902 (e.g., first die), and the second set of redistribution layers 910 is coupled to the second integrated device 904 (e.g., second die).

Figure 10:
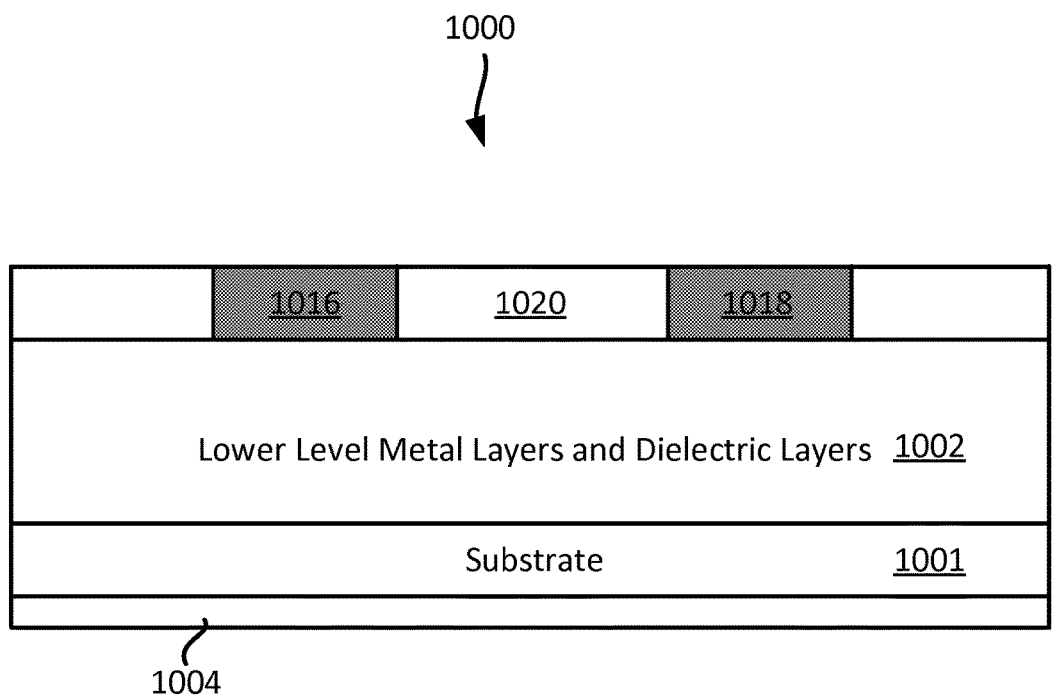
FIG. 10 illustrates an example of a die.

FIG. 10 conceptually illustrates an example of a die 1000 (which is a form of an integrated device). In some implementations, the die 1000 may correspond to the first integrated device 902 and/or the second integrated device 904 of FIG. 9. As shown in FIG. 10, the die 1000 (e.g., integrated device) includes a substrate 1001, several lower level metal layers and dielectric layers 1002, a first interconnect 1016 (e.g., first bump, first pillar interconnect), a second interconnect 1018 (e.g., second bump, second pillar interconnect), and an encapsulation layer 1020 (e.g., mold).

In some implementations, one or more redistribution layers (e.g., redistribution layers 908) are coupled to the die 1000 through the first interconnect 1016 and/or the second interconnect 1018.

Figure 11:
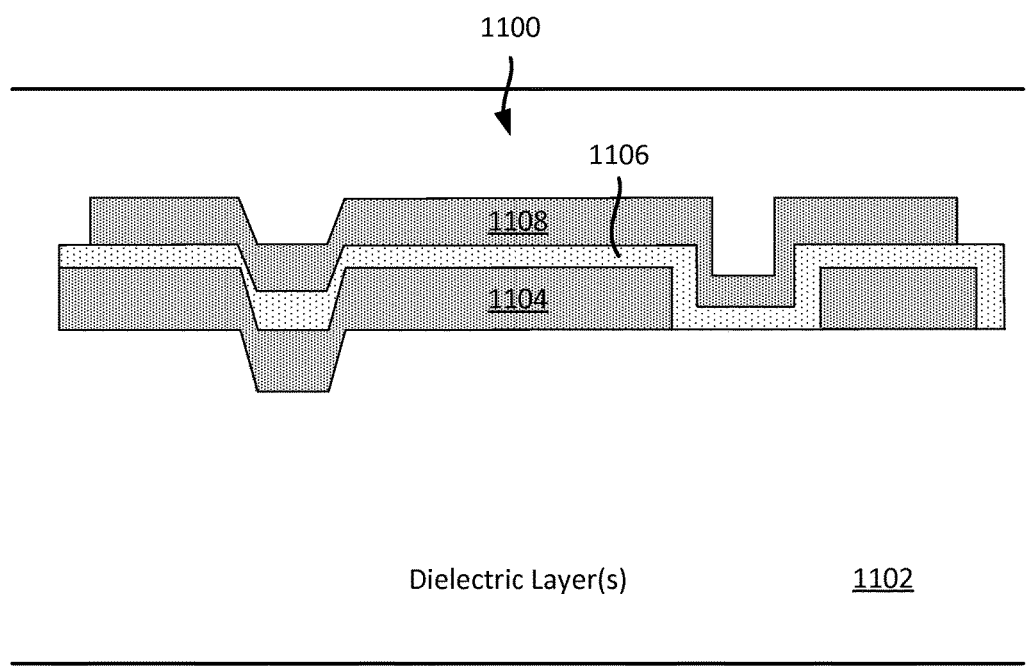
FIG. 11 illustrates a close up view of a capacitor in a redistribution layer (RDL) of a package.

FIG. 11 conceptually illustrates a close up view of the capacitor of FIG. 9, in some implementations. Specifically, FIG. 11 illustrates a capacitor 1100 in a dielectric layer 1102. In some implementations, the capacitor 1100 is a metal-insulation-metal (MIM) capacitor. In some implementations, the capacitor 1100 is a decoupling capacitor for a power distribution network (PDN) for an integrated device.

In some implementations, the capacitor 1100 may be implemented in an analog circuit. In some implementations, the capacitor 1100 may be implemented in resistor-capacitor (RC) filters (e.g., low pass filters, mid-band filters, high pass filters). In some implementations, the capacitor 1100 may be implemented in programmable filters. In some implementations, the capacitor 1100 may be implemented in oscillator circuits and input/output (I/O) decoupling for high frequency response.

In some implementations, the dielectric layer 1102 includes several dielectric layers. In some implementations, the capacitor 1100 corresponds with the capacitor 914 of FIG. 9. In some implementations, the capacitor 1100 may have a shape and configuration that is similar to the capacitors shown in FIGS. 4-8.

As shown in FIG. 11, the capacitor 1100 includes a first interconnect 1104 (e.g., first electrode), a first insulation layer 1106, and a second interconnect 1108 (e.g., second electrode). In some implementations, the first interconnect 1104, the first insulation layer 1106, and/or a second interconnect 1108 are in the redistribution structure (e.g., part of one or more redistribution layers) of an integrated device (e.g., integrated device 300). FIG. 11 illustrates that the first insulation layer 1106 and the second interconnect 1108 take the shape and/or form the first interconnect 1104. In some implementations, the first insulation layer 1106 is a high k dielectric layer(s). Examples of high k dielectric layer(s) include low temperature CVD, SiN, HfO, ZbO, ZnO, AlO, and ZrO. In some implementations, a high k dielectric layer has a dielectric constant value that is equal or greater than 5 (e.g., 5-80).

In some implementations, the capacitor may be positioned and/or located differently in and/or on the dielectric layer of an integrated device. For example, in some implementations, part of the capacitor may be on the surface of the dielectric layer of an integrated device.

Figure 12:
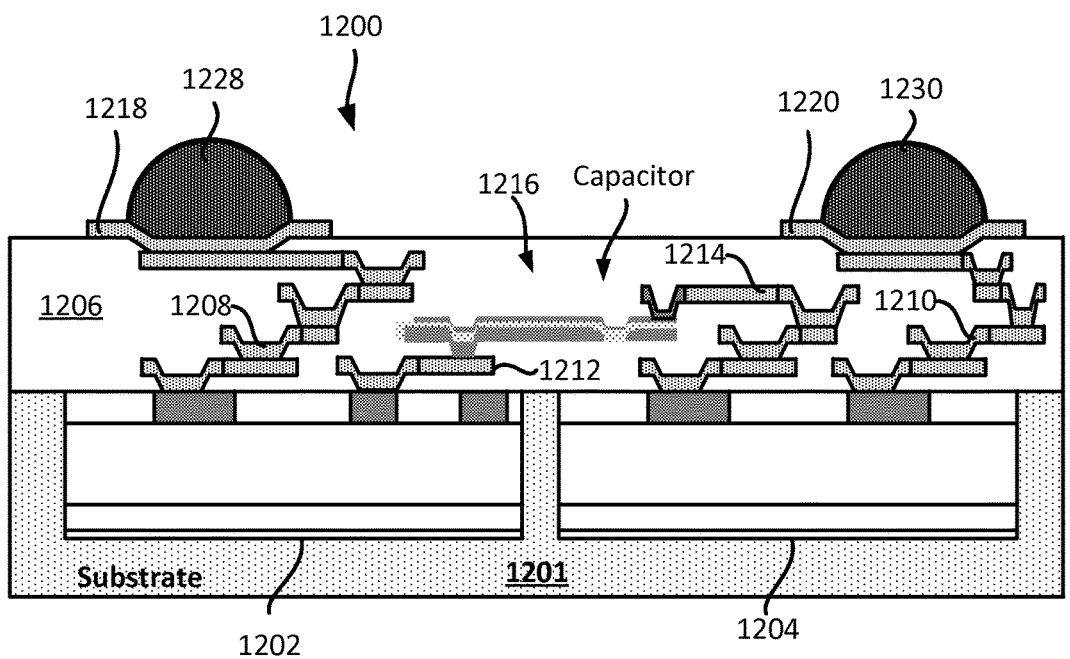
FIG. 12 illustrates another example of a package that includes a capacitor.

FIG. 12 conceptually illustrates an integrated device 1200 that includes several dies and a capacitor, where the capacitor is an inter die capacitor. As shown in FIG. 12, the integrated device 1200 (e.g., semiconductor device, package) includes a substrate 1201, a first integrated device 1202 (e.g., first die), a second integrated device 1204 (e.g., second die), a dielectric layer 1206, a first set of redistribution layers 1208, a second set of redistribution layers 1210, a third set of redistribution layers 1212, a fourth set of redistribution layers 1214, a capacitor 1216, a first under bump metallization (UBM) layer 1218, a second under bump metallization (UBM) layer 1220, a first solder ball 1228, and a second solder ball 1230. In some implementations, the dielectric layer 1206, the first set of redistribution layers 1208, the second set of redistribution layers 1210, the capacitor 1216, the first under bump metallization (UBM) layer 1218, and the second under bump metallization (UBM) layer 1220 are part of a redistribution structure (e.g., redistribution portion) of the integrated device 1200.

The shape and configuration of the capacitor 1216 in FIG. 12 is merely exemplary. Different implementations may have different shapes and configurations for the capacitor 1216. For example, the capacitor 1216 may have the shape and configuration of any of the capacitors previously described in FIGS. 4-8.

FIG. 12 illustrates the inter die capacitor 1216 is electrically coupled to the first die 1202 and the second die 1204. Specifically, FIG. 12 illustrates a bottom interconnect (e.g., bottom electrode) of the capacitor 1216 is coupled to the third set of redistribution layers 1212, which is coupled to a pad of the first die 1202. FIG. 12 also illustrates a top interconnect (e.g., top electrode) of the capacitor 1216 is coupled to the fourth set of redistribution layers 1214, which is coupled to a pad of the second die 1204. It should be noted that the electrical coupling of the capacitor 1216 in FIG. 12 is merely exemplary. In different implementations, the capacitor 1216 may be electrically coupled to the solder ball 1228 and/or the dies (e.g., dies 1202, 1204) using different electrical paths (e.g., different redistribution layers). For example, a first electrode (e.g., bottom electrode) of the capacitor 1216 may be coupled to third set of redistribution layers 1212, and a second electrode (e.g., top electrode) of the capacitor 1216 may be coupled to the fourth set of redistribution layers 1214. At least some of the first set of redistribution layers may be coupled to the die(s) and/or solder balls of the integrated package.

The substrate 1201 may include one of at least silicon, glass, ceramic, and/or dielectric. The first and second integrated devices 1202 & 1204 (e.g., first and second dies) are located (e.g., embedded) in the substrate 1201. In some implementations, the first and second integrated devices 1202 & 1204 are located in cavities and/or trenches of the substrate 1201. An example of a die was described in FIG. 10.

The first integrated device 1202 (e.g., first die) is coupled to the first set of redistribution layers 1208. The first set of redistribution layers 1208 may include one or more interconnects (e.g., metal layers) and/or one or more vias. The first set of redistribution layers 1208 is also coupled to the first UBM layer 1218. The first UBM layer 1218 is coupled to the first solder ball 1228.

The second integrated device 1204 (e.g., second die) is coupled to the second set of redistribution layers 1210. The second set of redistribution layers 1210 may include one or more interconnects (e.g., metal layers) and/or one or more vias. The second set of redistribution layers 1210 is also coupled to the second UBM layer 1220. The second UBM layer 1220 is coupled to the second solder ball 1230.

In some implementations, the first integrated device 1202 may be electrically coupled to the second integrated device 1204 through a set of redistribution layers in the redistribution portion of the integrated device. The set of redistribution layers may include one or more interconnects (e.g., metal layers) and/or one or more vias. The set of redistribution layers may be similar to the first and/or second distribution layers 1208 & 1210.

The first redistribution layers 1208, the second redistribution layers 1210, the third set of redistribution layers 1212, the fourth set of redistribution layers 1214, are located in the dielectric layer 1206. In some implementations, the dielectric layer 1206 includes several dielectric layers.

As described above, the integrated device 1200 includes a capacitor 1216. In some implementations, a portion of the capacitor 1216 may be on a surface of the integrated device. Specifically, in some implementations, a first portion of the capacitor 1216 is on the surface of the dielectric layer 1206, and a second portion of the capacitor 1216 is in the dielectric layer 1206. In some implementations, the capacitor 1216 is a metal-insulator-metal (MIM) capacitor. In some implementations, the capacitor 1216 is a decoupling capacitor for a power distribution network (PDN) for the integrated device 1200. In some implementations, the capacitor 1216 is coupled to the first set of redistribution layers 1208. The capacitor 1216 is positioned and/or located in the dielectric layer 1206. In some implementations, the capacitor 1216 includes several interconnects (e.g., redistribution layers, UBM layers, vias) and one or more insulation layers. In some implementations, the insulation layer includes a high k dielectric layer. In some implementations, the insulation layer is different than the dielectric layer 1206. In some implementations, the capacitor 1216 may have a shape and configuration that is similar to the capacitors shown in FIGS. 4-8. A more specific example of a capacitor is further described in FIG. 13.

As mentioned above, the first set of redistribution layers 1208 is coupled to the first integrated device 1202 (e.g., first die), and the second set of redistribution layers 1210 is coupled to the second integrated device 1204 (e.g., second die).

Figure 13:
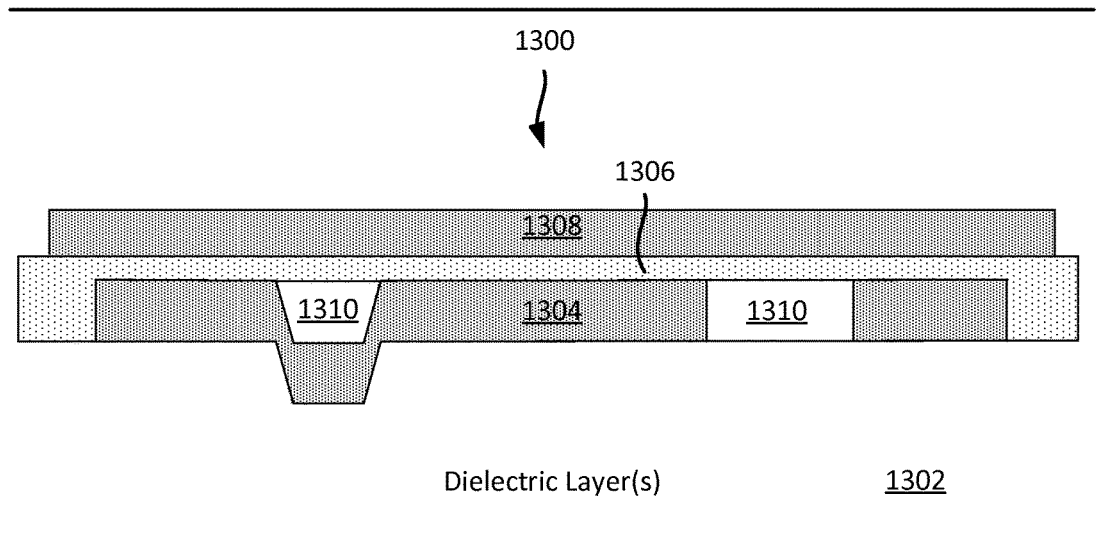
FIG. 13 illustrates a close up view of a capacitor in a redistribution layer (RDL) of a package.

FIG. 13 conceptually illustrates a close up view of a capacitor in a package. Specifically, FIG. 13 illustrates a capacitor 1300 in a dielectric layer 1302. In some implementations, the capacitor 1300 is a metal-insulation-metal (MIM) capacitor. In some implementations, the capacitor 1300 is a decoupling capacitor for a power distribution network (PDN) for an integrated device.

In some implementations, the capacitor 1300 may be implemented in an analog circuit. In some implementations, the capacitor 1300 may be implemented in resistor-capacitor (RC) filters (e.g., low pass filters, mid-band filters, high pass filters). In some implementations, the capacitor 1300 may be implemented in programmable filters. In some implementations, the capacitor 1300 may be implemented in oscillator circuits and input/output (I/O) decoupling for high frequency response.

In some implementations, the dielectric layer 1302 includes several dielectric layers. In some implementations, the capacitor 1300 corresponds with the capacitor 1216 of FIG. 12. In some implementations, the capacitor 1300 may have a shape and configuration that is similar to the capacitors shown in FIGS. 4-8.

As shown in FIG. 13, the capacitor 1300 includes a first interconnect 1304 (e.g., first electrode), a first insulation layer 1306, a second interconnect 1308 (e.g., second electrode), and a second insulation layer 1310. In some implementations, the first interconnect 1304, the first insulation layer 1306, the second interconnect 1308, and/or the second insulation layer 1310 are in the redistribution structure (e.g., part of one or more redistribution layers) of an integrated device (e.g., integrated device 1200). In some implementations, the first insulation layer 1306 is a high k dielectric layer(s) (e.g., dielectric with a dielectric constant equal or greater than 5 (e.g., 5-80 range)).

As shown in FIG. 13, the second interconnect 1308 and the first insulation layer 1306 have a planar (e.g., substantially flat) surface even though the first interconnect 1304 is not perfectly planar. This is achieved by forming a second insulation layer 1310 in gaps between the first interconnect 1304.

Figure 14:
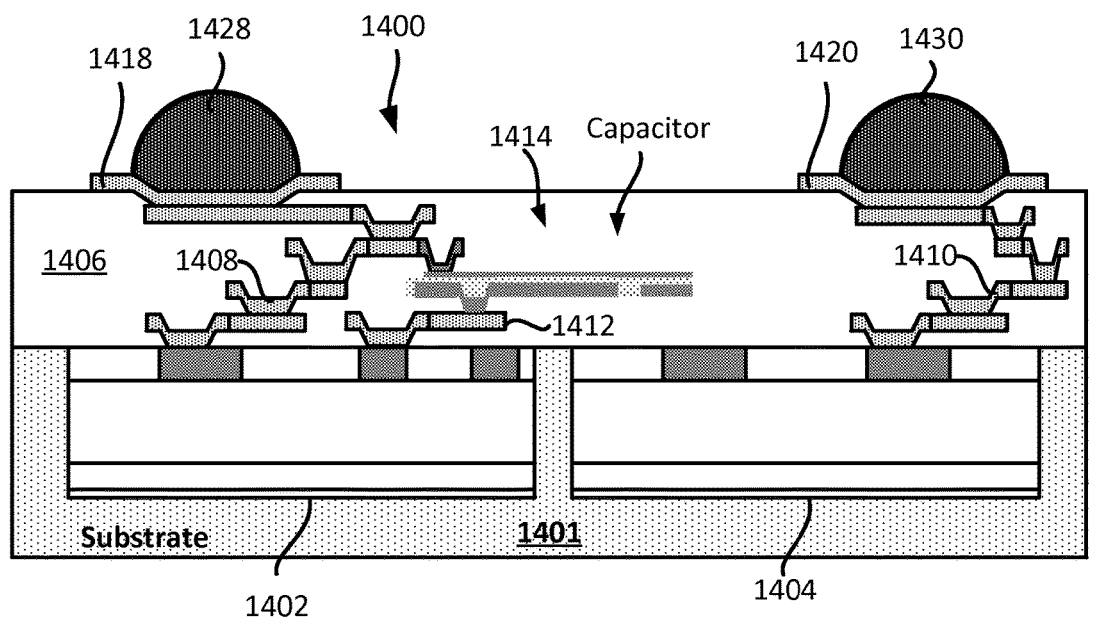
FIG. 14 illustrates another example of a package that includes a capacitor.
Figure 15:
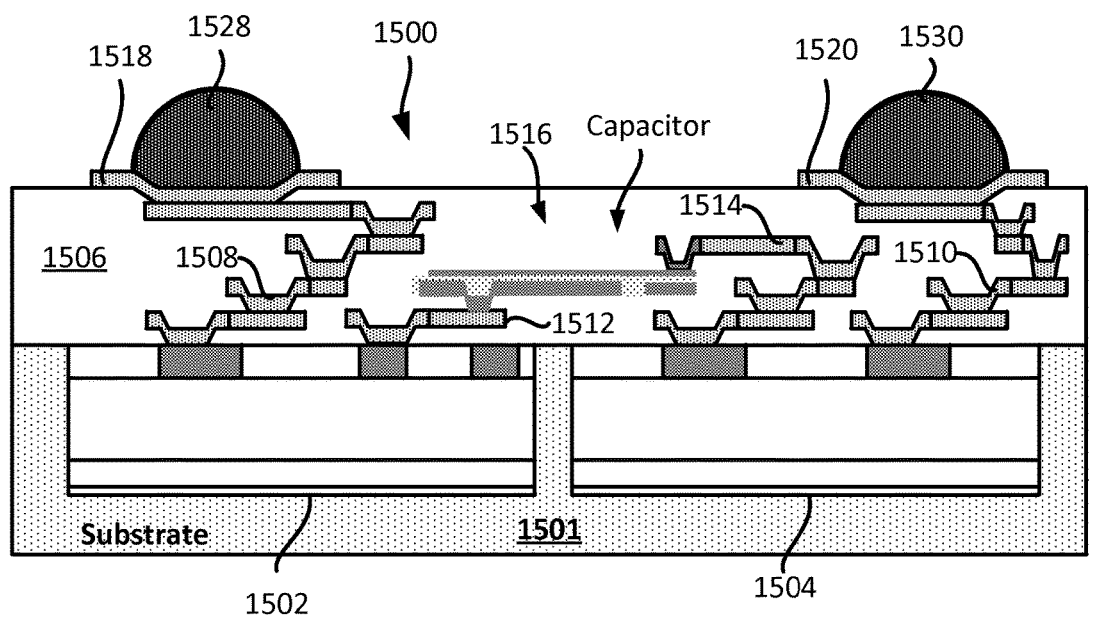
FIG. 15 illustrates another example of a package that includes a capacitor.

FIGS. 14 and 15 illustrate several packages that may include capacitors that are similar or the same as the capacitor 1300 of FIG. 13.

FIG. 14 conceptually illustrates an integrated device 1400 that includes several dies, and a capacitor. As shown in FIG. 14, the integrated device 1400 (e.g., semiconductor device, package) includes a substrate 1401, a first integrated device 1402 (e.g., first die), a second integrated device 1404 (e.g., second die), a dielectric layer 1406, a first set of redistribution layers 1408, a second set of redistribution layers 1410, a third set of redistribution layers 1412, a capacitor 1414, a first under bump metallization (UBM) layer 1418, a second under bump metallization (UBM) layer 1420, a first solder ball 1428, and a second solder ball 1430. In some implementations, the dielectric layer 1406, the first set of redistribution layers 1408, the second set of redistribution layers 1410, the third set of redistribution layers 1412, the capacitor 1414, the first under bump metallization (UBM) layer 1418, and the second under bump metallization (UBM) layer 1420 are part of a redistribution structure (e.g., redistribution portion) of the integrated device 1400.

FIG. 14 illustrates the capacitor 1414 is electrically coupled to the first die 1402. Specifically, FIG. 14 illustrates a bottom interconnect (e.g., bottom electrode) of the capacitor 1414 is coupled to the third set of redistribution layers 1412, which is coupled to a pad of the first die 1402. FIG. 14 also illustrates a top interconnect (e.g., top electrode) of the capacitor 1414 is coupled to the first set of redistribution layers 1408, which is coupled to a pad of the first die 1402.

In some implementations, the first integrated device 1402 may be electrically coupled to the second integrated device 1404 through a set of redistribution layers in the redistribution portion of the integrated device. The set of redistribution layers may include one or more interconnects (e.g., metal layers) and/or one or more vias. The set of redistribution layers may be similar to the first and/or second distribution layers 1408 & 1410.

In some implementations, the capacitor 1414 is a metal-insulation-metal (MIM) capacitor. In some implementations, the capacitor 1414 is a decoupling capacitor for a power distribution network (PDN) for an integrated device. The capacitor 1414 is in the dielectric layer 1406. The capacitor 1414 includes a first non-planar metal layer (e.g., bottom metal layer), a planar insulation layer, and a second planar metal layer (e.g., top metal layer). An example of the capacitor 1414 is described in FIG. 8 above.

FIG. 15 conceptually illustrates an integrated device 1500 that includes several dies, and a capacitor, where the capacitor is an inter die capacitor. As shown in FIG. 15, the integrated device 1500 (e.g., semiconductor device, package) includes a substrate 1501, a first integrated device 1502 (e.g., first die), a second integrated device 1504 (e.g., second die), a dielectric layer 1506, a first set of redistribution layers 1508, a second set of redistribution layers 1510, a third set of redistribution layers 1512, a fourth set of redistribution layers 1514, a capacitor 1516, a first under bump metallization (UBM) layer 1518, a second under bump metallization (UBM) layer 1520, a first solder ball 1528, and a second solder ball 1530. In some implementations, the dielectric layer 1506, the first set of redistribution layers 1508, the second set of redistribution layers 1510, the third set of redistribution layers 1512, the third set of redistribution layers 1514, the capacitor 1516, the first under bump metallization (UBM) layer 1518, and the second under bump metallization (UBM) layer 1520 are part of a redistribution structure (e.g., redistribution portion) of the integrated device 1500.

FIG. 15 illustrates the inter die capacitor 1516 is electrically coupled to the first die 1502 and the second die 1504. Specifically, FIG. 15 illustrates a bottom interconnect (e.g., bottom electrode) of the capacitor 1516 is coupled to the third set of redistribution layers 1512, which is coupled to a pad of the first die 1502. FIG. 15 also illustrates a top interconnect (e.g., top electrode) of the capacitor 1516 is coupled to the fourth set of redistribution layers 1514, which is coupled to a pad of the second die 1504.

In some implementations, the first integrated device 1502 may be electrically coupled to the second integrated device 1504 through a set of redistribution layers in the redistribution portion of the integrated device. The set of redistribution layers may include one or more interconnects (e.g., metal layers) and/or one or more vias. The set of redistribution layers may be similar to the first and/or second distribution layers 1508 & 1510.

In some implementations, the capacitor 1516 is a metal-insulation-metal (MIM) capacitor. In some implementations, the capacitor 1516 is a decoupling capacitor for a power distribution network (PDN) for an integrated device. A first part of the capacitor 1516 is on a surface of the dielectric layer 1506, and a second part of the capacitor 1516 is in the dielectric layer 1506. The capacitor 1516 includes a first non-planar metal layer (e.g., top metal layer), a planar insulation layer, and a second planar metal layer (e.g., bottom metal layer). The first planar metal layer is on the surface of the dielectric layer 1506. The planar insulation layer and the second planar metal layer is in the dielectric layer 1506. An example of the capacitor 1516 is described in FIG. 8 above.

Exemplary Integrated Device that Includes Capacitor and Mold

Figure 16:
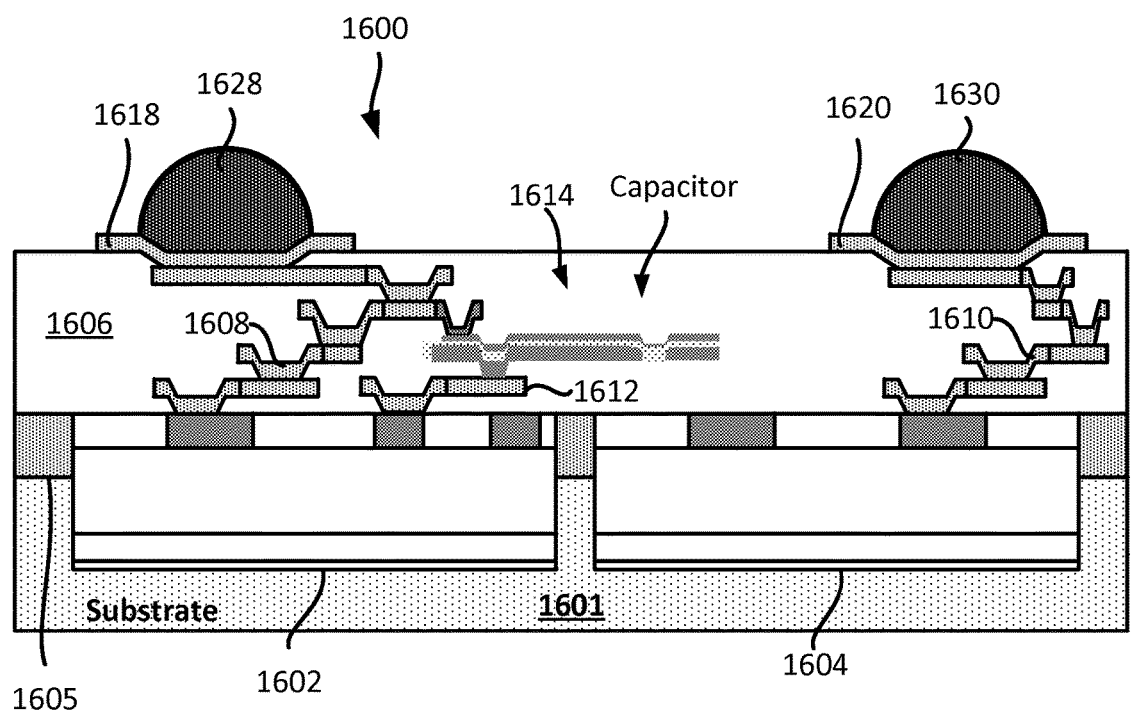
FIG. 16 illustrates another example of a package that includes a capacitor.

FIG. 16 conceptually illustrates an integrated device 1600 that includes several dies. As shown in FIG. 16, the integrated device 1600 (e.g., semiconductor device, package) includes a substrate 1601, a first integrated device 1602 (e.g., first die), a second integrated device 1604 (e.g., second die), an encapsulation layer 1605 (e.g., mold), a dielectric layer 1606, a first set of redistribution layers 1608, a second set of redistribution layers 1610, a third set of redistribution layers 1612, a capacitor 1614, a first under bump metallization (UBM) layer 1618, a second under bump metallization (UBM) layer 1620, a first solder ball 1628, and a second solder ball 1630. In some implementations, the dielectric layer 1606, the first set of redistribution layers 1608, the second set of redistribution layers 1610, the third set of redistribution layers 1612, the capacitor 1614, the first under bump metallization (UBM) layer 1618, and the second under bump metallization (UBM) layer 1620 are part of a redistribution structure (e.g., redistribution portion) of the integrated device 1600.

It should be noted that the encapsulation layer 1605 may be implemented in any of the integrated device described in the present disclosure, and is not limited to only the integrated device of FIG. 16.

The substrate 1601 may include one of at least silicon, glass, ceramic, and/or dielectric. The first and second integrated devices 1602 & 1604 (e.g., first and second dies) are located (e.g., embedded) in the substrate 1601. In some implementations, the first and second integrated devices 1602 & 1604 are located in cavities and/or trenches of the substrate 1601. An example of a die was described in FIG. 10.

The first integrated device 1602 (e.g., first die) is coupled to the first set of redistribution layers 1608. The first set of redistribution layers 1608 may include one or more interconnects (e.g., metal layers) and/or one or more vias. The first set of redistribution layers 1608 is also coupled to the first UBM layer 1618. The first UBM layer 1618 is coupled to the first solder ball 1628.

The second integrated device 1604 (e.g., second die) is coupled to the second set of redistribution layers 1610. The second set of redistribution layers 1610 may include one or more interconnects (e.g., metal layers) and/or one or more vias. The second set of redistribution layers 1610 is also coupled to the second UBM layer 1620. The second UBM layer 1620 is coupled to the second solder ball 1630.

FIG. 16 illustrates the capacitor 1614 is electrically coupled to the first die 1602. Specifically, FIG. 16 illustrates a bottom interconnect (e.g., bottom electrode) of the capacitor 1614 is coupled to the third set of redistribution layers 1612, which is coupled to a pad of the first die 1602. FIG. 16 also illustrates a top interconnect (e.g., top electrode) of the capacitor 1614 is coupled to the first set of redistribution layers 1608, which is coupled to a pad of the first die 1602.

In some implementations, the first integrated device 1602 may be electrically coupled to the second integrated device 1604 through a set of redistribution layers. The set of redistribution layers may include one or more interconnects (e.g., metal layers) and/or one or more vias.

The first redistribution layers 1608, the second redistribution layers 1610, and the third redistribution layers 1612 are located in the dielectric layer 1606. In some implementations, the dielectric layer 1606 includes several dielectric layers.

As described above, the integrated device 1600 includes a capacitor 1614. In some implementations, the capacitor 1614 is metal-insulator-metal (MIM) capacitor. In some implementations, the capacitor 1614 is a decoupling capacitor for a power distribution network (PDN) for the integrated device 1600. In some implementations, the capacitor 1614 is coupled to the first set of redistribution layers 1608. The capacitor 1614 is positioned and/or located in the dielectric layer 1606. In some implementations, the capacitor 1614 includes several interconnects (e.g., redistribution layers, UBM layers, vias) and one or more insulation layers. In some implementations, the insulation layer includes a high k dielectric layer (e.g., dielectric with a dielectric constant equal or greater than 5 (e.g., 5-80 range)). In some implementations, the insulation layer is different than the dielectric layer 1606. In some implementations, the capacitor 1614 may have a shape and configuration that is similar to the capacitors shown in FIGS. 4-8.

As mentioned above, the first set of redistribution layers 1608 is coupled to the first integrated device 1602 (e.g., first die), and the second set of redistribution layers 1610 is coupled to the second integrated device 1604 (e.g., second die).

Exemplary Sequence for Manufacturing a Capacitor in an Integrated Device

Figure 17A:
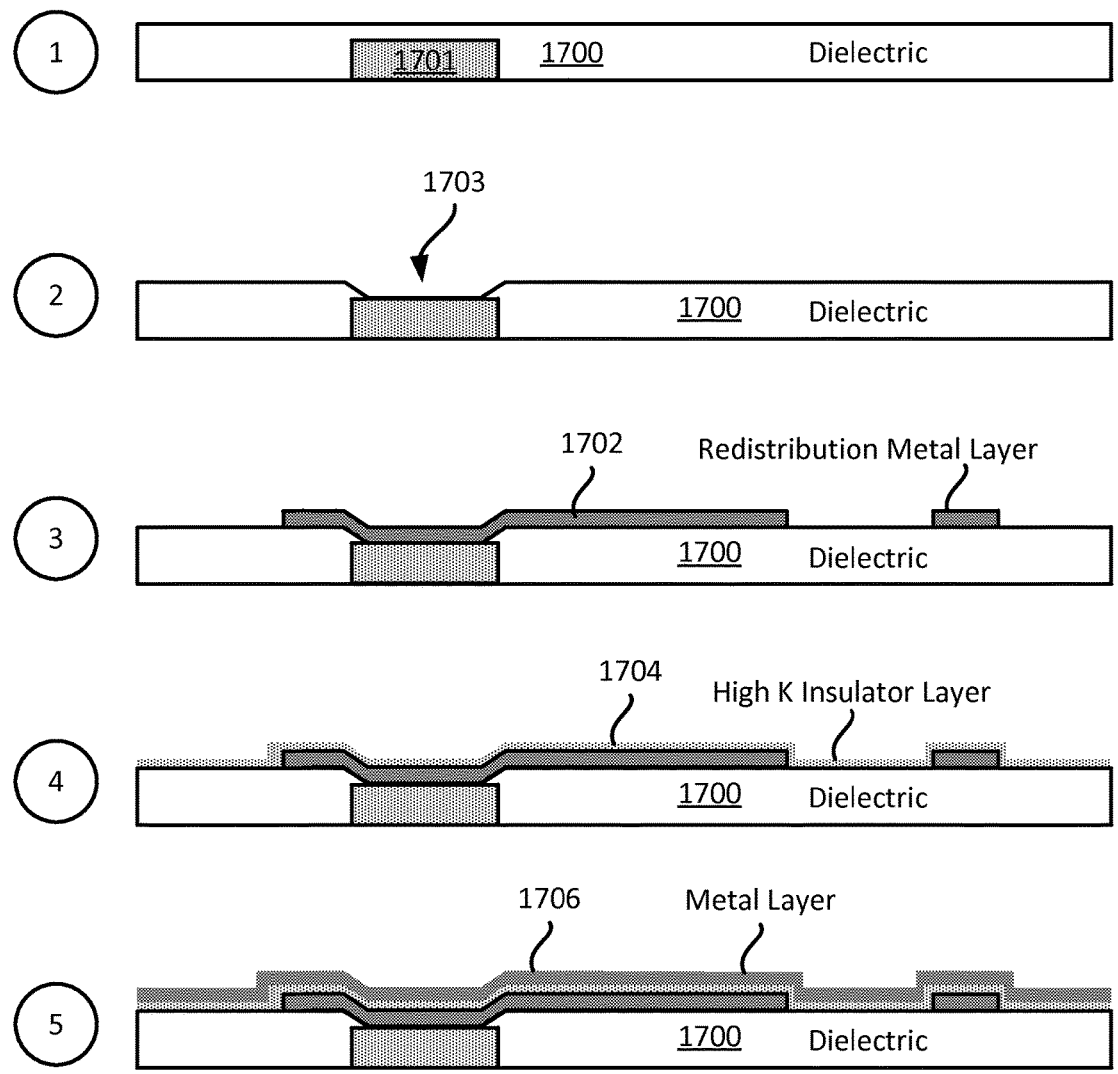
FIG. 17A illustrates part of an exemplary sequence for providing/manufacturing a capacitor in a redistribution portion of an integrated device.
Figure 17B:
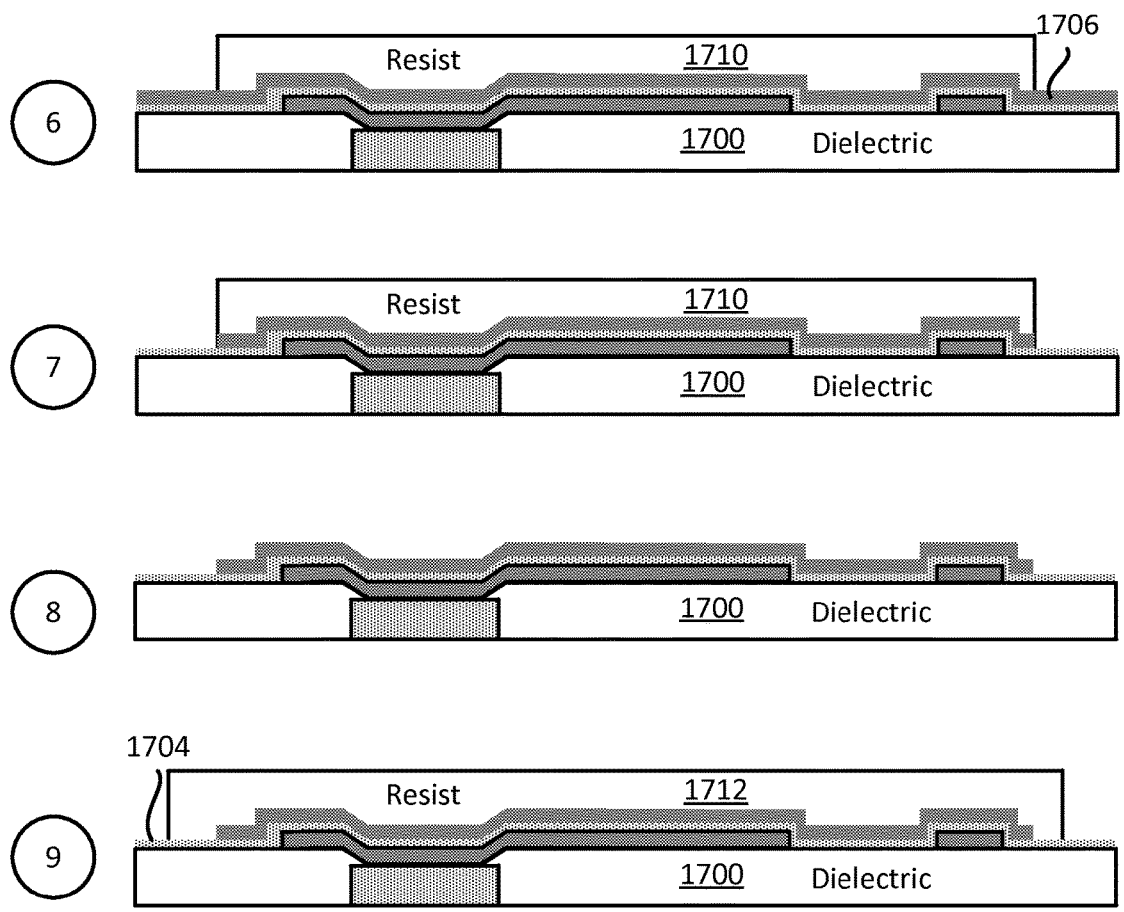
FIG. 17B illustrates part of an exemplary sequence for providing/manufacturing a capacitor in a redistribution portion of an integrated device.
Figure 17C:
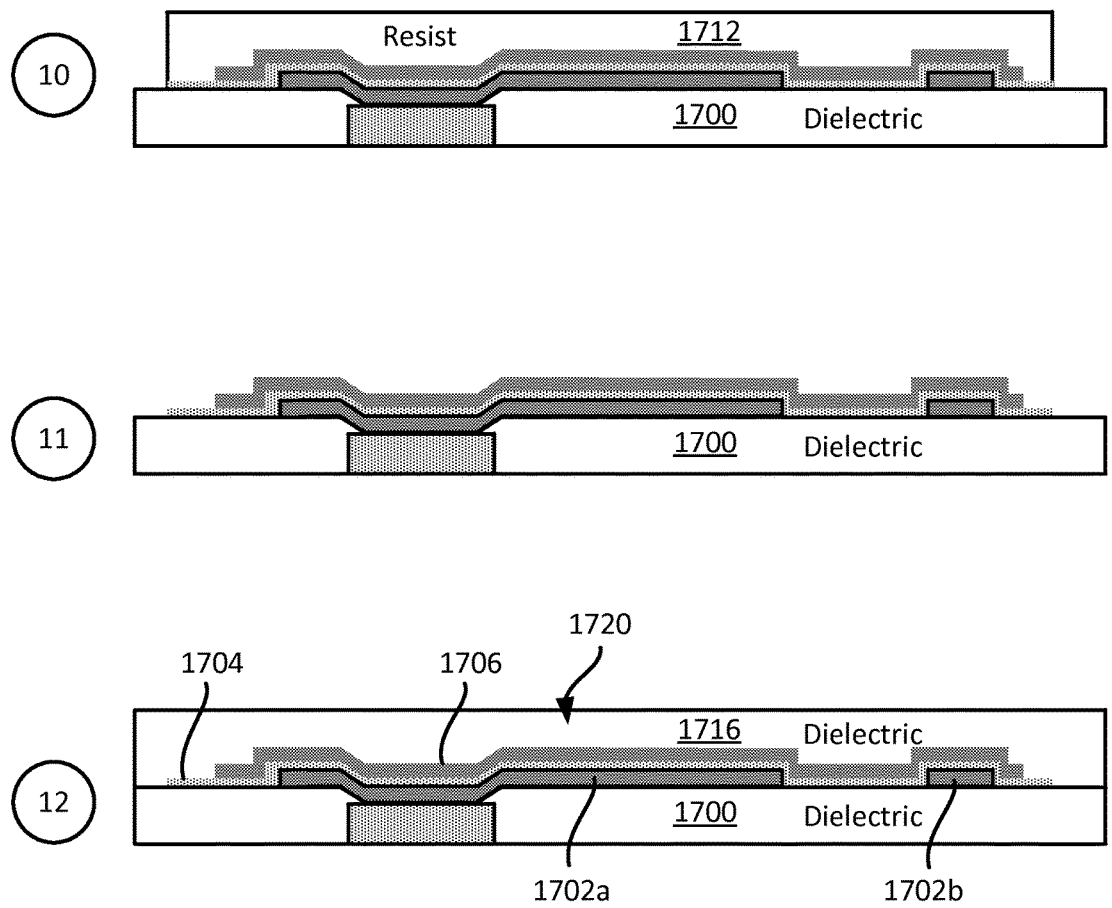
FIG. 17C illustrates part of an exemplary sequence for providing/manufacturing a capacitor in a redistribution portion of an integrated device.

Different implementations may provide/manufacture a capacitor in an integrated device differently. FIGS. 17A-17C illustrate an exemplary sequence for providing (e.g., forming) an a capacitor in an integrated device (e.g., semiconductor device, die, die package, integrated package device).

In some implementations, the sequence of FIGS. 17A-17C may be used to provide/manufacture the integrated device of FIGS. 2-3, 7-9, 12 and/or 14-16, and/or other integrated devices (e.g., dies) described in the present disclose. It should be noted that the sequence of FIGS. 17A-17C may combine one or more stages in order to simplify and/or clarify the sequence for providing a capacitor in an integrated device.

It should also be noted that not all of the components of an integrated device are shown in FIGS. 17A-17C. In particular, for the purpose of clarity, only a part of a redistribution structure (e.g., redistribution portion) of an integrated device is shown to clearly illustrate how a capacitor may be provided in the redistribution structure of an integrated device (e.g., redistribution structure of integrated devices 200 & 900).

As shown in stage 1 of FIG. 17A, a dielectric layer (e.g., dielectric layer 1700) is provided. Different implementations may use different materials for the dielectric layer. The dielectric layer 1700 includes a pad 1701.

At stage 2, a cavity (e.g., cavity 1703) is provided/created in the dielectric layer (e.g., dielectric layer 1700). Different implementations may use different processes for providing the cavity in the dielectric layer. In some implementations, an etching process may be used to create the dielectric layer.

At stage 3, a first metal redistribution layer (e.g., redistribution layer 1702) is provided. Specifically, a redistribution layer 1702 (which in redistribution layer 1702a and 1702b) is provided over the cavity 1703 and the dielectric layer 1700. In some implementations, the metal redistribution layer is a copper layer. Different implementations may use different processes for providing the metal redistribution layer. In some implementations, plating and/or etching processes are used to provide the metal redistribution layer.

At stage 4, an insulation layer 1704 is provided on the redistribution layer 1702 and the dielectric layer 1700. In some implementations, the insulation layer 1704 is a high k dielectric layer (e.g., dielectric with a dielectric constant equal or greater than 5 (e.g., 5-80 range)). Different implementations may use different processes for providing the insulation layer 1704. In some implementations, the insulation layer 1704 may be provided by using one or more coating processes, such as chemical vapor deposition (CVD) or atomic layer deposition (ALD).

At stage 5, a second metal layer 1706 is provided on the insulation layer 1704. Different implementations may use different processes for providing the second metal layer 1706. In some implementations, the second metal layer 1706 may be provided by using one or more coating processes, such a physical vapor deposition (PVD). In some implementations, the second metal layer 1706 is one of at least titanium (Ti), (TiN), Aluminium Copper (AlCu), titanium copper alloy (TiCu) and/or titanium tungsten copper alloy (TiWCu). However, different implementations may use different materials for the second metal layer 1706.

As shown at stage 6 of FIG. 17B, a first resist layer 1710 is provided on at least some of the second metal layer 1706. In some implementations, providing the first resist layer 1710 includes providing the first resist layer 1710 over the entire second metal layer 1706 and selectively etching portions of the first resist layer 1710.

At stage 7, portions of the second metal layer 1706 are selectively etched (e.g., selectively wet etched). In some implementations, the portions of the second metal layer 1706 that are selectively etched are the portions that are not covered by the first resist layer 1710 (e.g., portions that are exposed and/or free of coverage of the first resist layer 1710). As further shown at stage 7, when selected portions of the second metal layer 1706 are etched, it exposes selected portions of the insulation layer 1704. In some implementations, the selective etching (e.g., selective wet etching) of the second metal layer 1706 does not damage the insulation layer 1704 (which may be a high k dielectric layer).

At stage 8, the first resist layer 1710 is removed (e.g., etched out, stripped). In some implementations, the removing of the first resist layer 1710 does not damage the insulation layer 1704.

At stage 9, a second resist layer 1712 is provided on at least some of the second metal layer 1706 and the insulation layer 1704. In some implementations, providing the second resist layer 1712 includes providing the second resist layer 1712 over the entire second metal layer 1706 and the insulation layer 1704, and selectively etching portions of the second resist layer 1712. In some implementations, the second resist layer 1712 covers a different area than the first resist layer 1710.

As shown at stage 10 of FIG. 17C, portions of the insulation area 1704 are selectively etched (e.g., selectively wet etched, selectively reactive-ion etched). In some implementations, the portions of the insulation layer 1704 that are selectively etched are the portions that are not covered by the second resist layer 1712 (e.g., portions that are exposed and/or free of coverage of the second resist layer 1712). As further shown at stage 10, when selected portions of the insulation layer 1704 are etched, it exposes selected portions of the dielectric layer 1700.

At stage 11, the second resist layer 1712 is removed (e.g., etched out, stripped). In some implementations, the removing of the second resist layer 1712 does not damage the insulation layer 1704.

At stage 12, a second dielectric layer 1716 is provided. The second dielectric layer 1716 may cover the dielectric layer 1700, the first metal layer 1702, the insulation layer 1704, and/or the second metal layer 1706 in some implementations. In some implementations, the first metal layer 1702 (e.g., metal layer 1702a and metal layer 1702b), the insulation layer 1704, and the second metal layer 1706 define a capacitor 1414. In some implementations, the capacitor 1414 is a metal-insulator-metal (MIM) capacitor. As shown at stage 12, the insulation layer 1704, and the second metal layer 1706 take the form and/or shape of the first metal layer 1702, which includes metal layer 1702a and metal layer 1702b.

Exemplary Sequence for Manufacturing a Capacitor in an Integrated Device

Figure 18A:
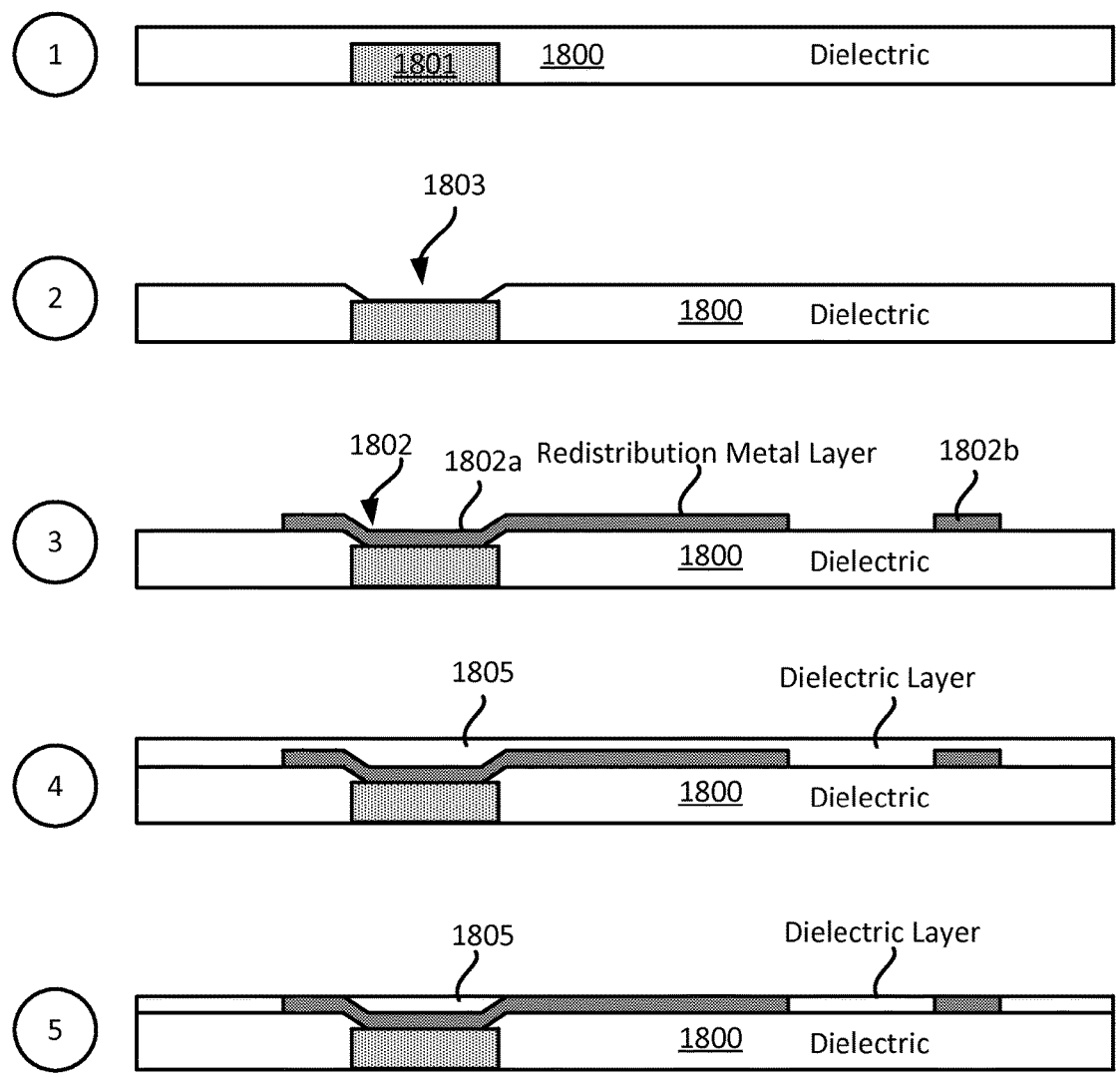
FIG. 18A illustrates part of an exemplary sequence for providing/manufacturing a capacitor in a redistribution portion of an integrated device.
Figure 18B:
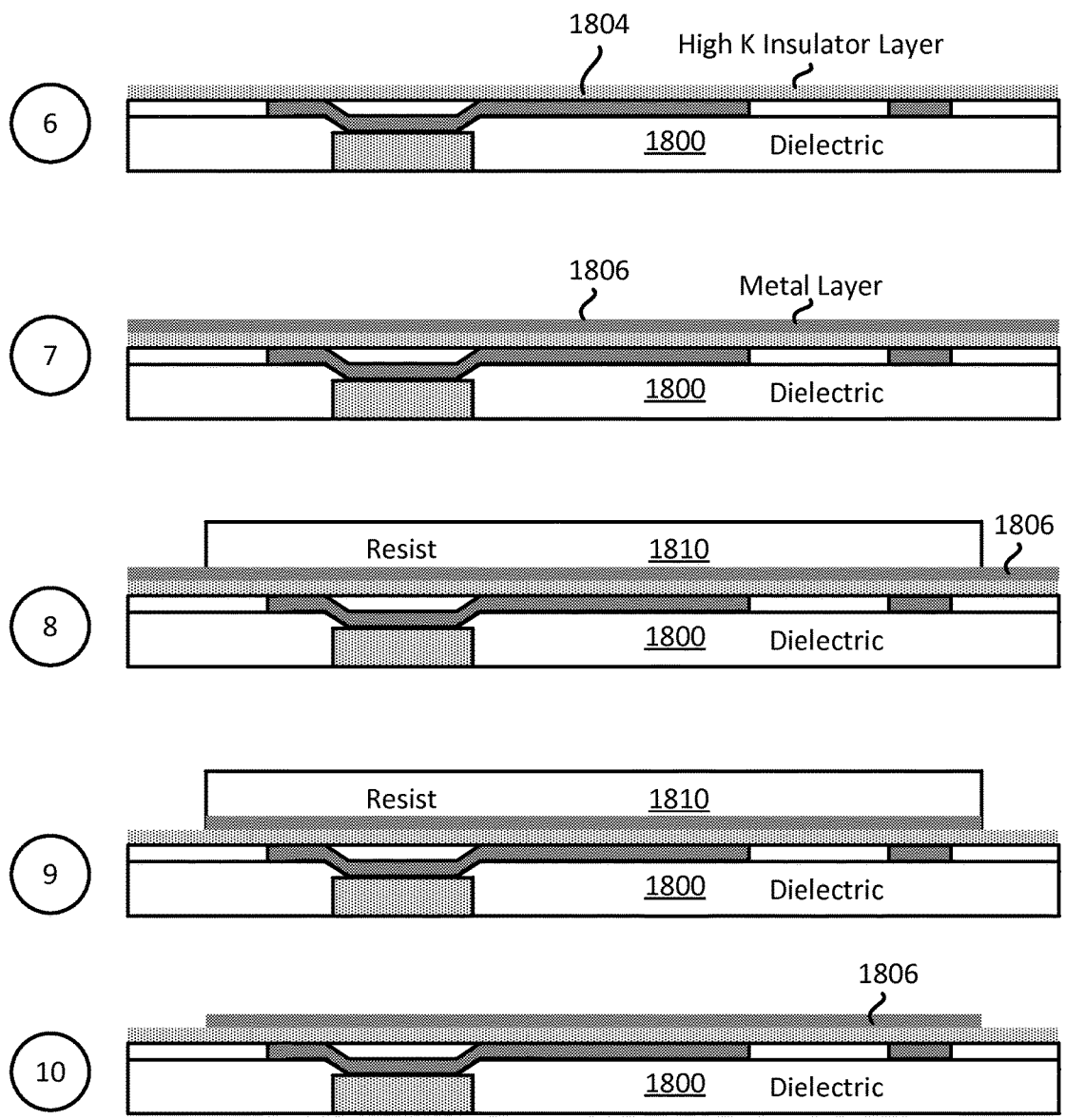
FIG. 18B illustrates part of an exemplary sequence for providing/manufacturing a capacitor in a redistribution portion of an integrated device.
Figure 18C:
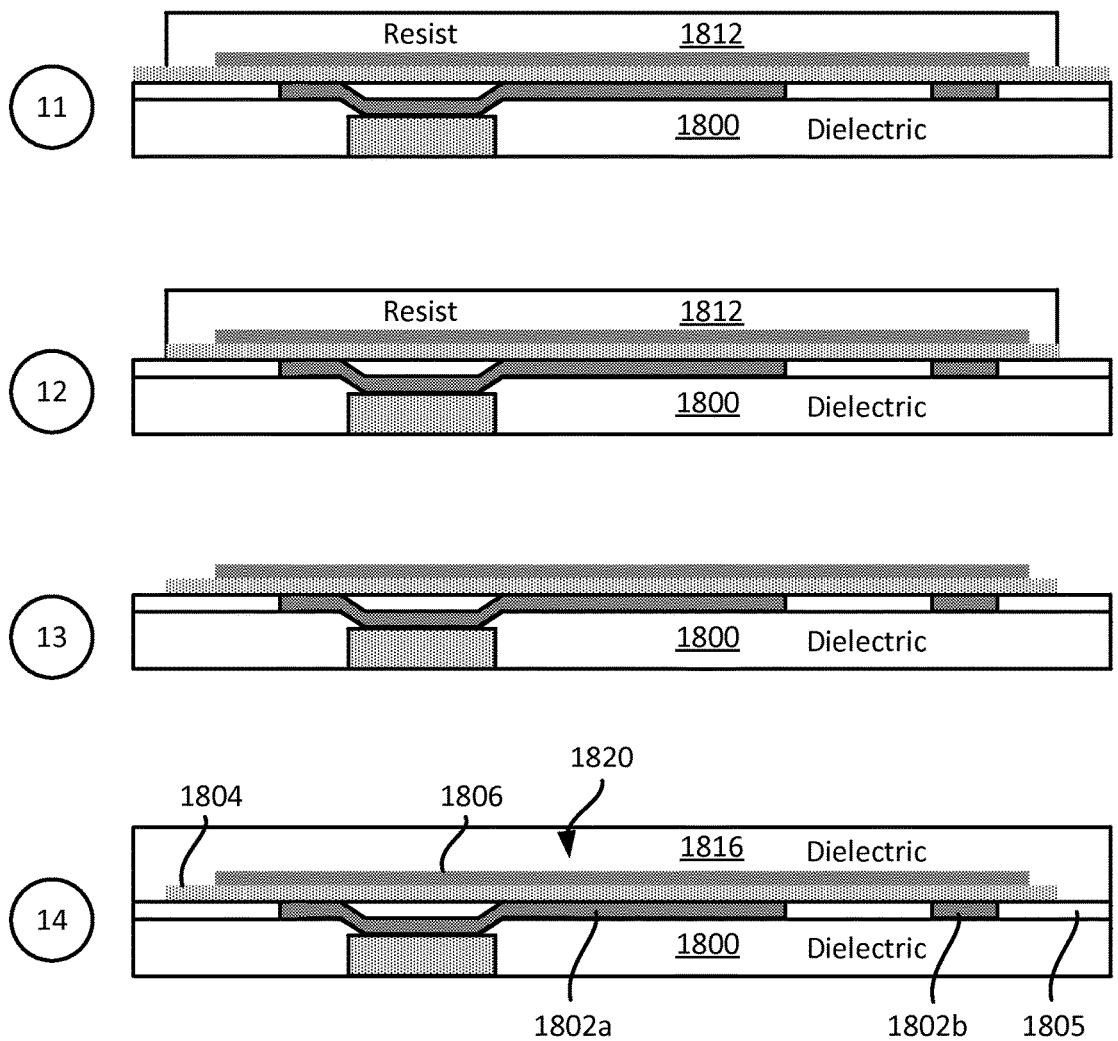
FIG. 18C illustrates part of an exemplary sequence for providing/manufacturing a capacitor in a redistribution portion of an integrated device.

Different implementations may provide/manufacture a capacitor in an integrated device differently. FIGS. 18A-18C illustrate an exemplary sequence for providing (e.g., forming) a capacitor in an integrated device (e.g., semiconductor device, die, die package, integrated package device).

In some implementations, the sequence of FIGS. 18A-18C may be used to provide/manufacture/fabricate the integrated device of FIGS. 2-3, 7-9, 12 and/or 14-16, and/or other integrated devices (e.g., dies) described in the present disclose. It should be noted that the sequence of FIGS. 18A-18C may combine one or more stages in order to simplify and/or clarify the sequence for providing a capacitor in an integrated device.

It should also be noted that not all of the components of an integrated device are shown in FIGS. 18A-18C. In particular, for the purpose of clarity, only a part of a redistribution structure (e.g., redistribution portion) of an integrated device is shown to clearly illustrate how a capacitor may be provided (e.g., fabricated) in the redistribution structure of an integrated device (e.g., redistribution structure of integrated devices 200 & 900).

As shown in stage 1 of FIG. 18A, a dielectric layer (e.g., dielectric layer 1800) is provided (e.g., formed). Different implementations may use different materials for the dielectric layer. The dielectric layer 1800 includes a pad 1801.

At stage 2, a cavity (e.g., cavity 1803) is provided/created in the dielectric layer (e.g., dielectric layer 1800). Different implementations may use different processes for providing the cavity in the dielectric layer. In some implementations, an etching process may be used to create the dielectric layer.

At stage 3, a first metal redistribution layer (e.g., redistribution layer 1802) is provided (e.g., formed). Specifically, a redistribution layer 1802 (which in redistribution layer 1802a and 1802b) is provided (e.g., formed) over the cavity 1803 and the dielectric layer 1800. In some implementations, the metal redistribution layer is a copper layer. Different implementations may use different processes for providing the metal redistribution layer. In some implementations, plating and/or etching processes are used to provide the metal redistribution layer.

At stage 4, a second dielectric layer 1805 is provided (e.g., formed) over the dielectric layer 1800 and the first set of interconnects 1802 (e.g., interconnects 1802a-1802b). In some implementations, the second dielectric layer 1805 is the same material as the dielectric layer 1800. The second dielectric layer 1805 may be equal or greater in height than the first set of interconnects 1802. In some implementations, the second dielectric layer 1805 is formed over the dielectric layer 1800 such that the second dielectric layer 1805 is planar (e.g., flush) to the surface of the first set of interconnects 1802.

At stage 5, which may be optional in some instances, excess second dielectric layer 1805 is removed so that the remaining second dielectric layer 1805 is planar (e.g., flush) to the surface of the first set of interconnects 1802. Different implementations may remove the excess second dielectric layer 1805 differently. In some implementations, excess second dielectric layer 1805 is removed by polishing or grinding away the excess second dielectric layer 1805. It should be noted that the removal of the second dielectric layer 1805 may not be necessary in some implementations when the second dielectric layer 1805 is already planar (e.g., flush) to the surface of the first set of interconnects 1802. As shown at stage 5, the remaining second dielectric layer 1805 is between the interconnect 1802a and the interconnect 1802b.

At stage 6 of FIG. 18B, an insulation layer 1804 is provided on the redistribution layer 1802 and the second dielectric layer 1805. As shown at stage 6, the insulation layer 1804 is planar or substantially planar (e.g., flat), even though the interconnect 1802 may not be planar across a cross section of the interconnect 1802. This is because the second dielectric layer 1805 was used to even out the surface of the redistribution layer. In some implementations, the insulation layer 1804 is a high k dielectric layer (e.g., dielectric with a dielectric constant equal or greater than 5 (e.g., 5-80 range)). Different implementations may use different processes for providing the insulation layer 1804. In some implementations, the insulation layer 1804 may be provided by using one or more coating processes, such as chemical vapor deposition (CVD) or atomic layer deposition (ALD).

At stage 7, a second metal layer 1806 is provided on the insulation layer 1804. As shown at stage 7, the second metal layer 1806 is planar or substantially planar (e.g., flat) since it is formed over the insulation layer 1804 which is planar or substantially planar. Different implementations may use different processes for providing the second metal layer 1806. In some implementations, the second metal layer 1806 may be provided by using one or more coating processes, such a physical vapor deposition (PVD). In some implementations, the second metal layer 1806 is one of at least titanium (Ti), (TiN), Aluminium Copper (AlCu), titanium copper alloy (TiCu) and/or titanium tungsten copper alloy (TiWCu). However, different implementations may use different materials for the second metal layer 1806.

As shown at stage 8, a first resist layer 1810 is provided on at least some of the second metal layer 1806. In some implementations, providing the first resist layer 1810 includes providing the first resist layer 1810 over the entire second metal layer 1806 and selectively etching portions of the first resist layer 1810.

At stage 9, portions of the second metal layer 1806 are selectively etched (e.g., selectively wet etched). In some implementations, the portions of the second metal layer 1806 that are selectively etched are the portions that are not covered by the first resist layer 1810 (e.g., portions that are exposed and/or free of coverage of the first resist layer 1810). As further shown at stage 7, when selected portions of the second metal layer 1806 are etched, it exposes selected portions of the insulation layer 1804. In some implementations, the selective etching (e.g., selective wet etching) of the second metal layer 1806 does not damage the insulation layer 1804 (which may be a high k dielectric layer).

At stage 10, the first resist layer 1810 is removed (e.g., etched out, stripped). In some implementations, the removing of the first resist layer 1810 does not damage the insulation layer 1804.

At stage 11 of FIG. 18C, a second resist layer 1812 is provided on at least some of the second metal layer 1806 and the insulation layer 1804. In some implementations, providing the second resist layer 1812 includes providing the second resist layer 1812 over the entire second metal layer

1806 and the insulation layer 1804, and selectively etching portions of the second resist layer 1812. In some implementations, the second resist layer 1812 covers a different area than the first resist layer 1810.

As shown at stage 12, portions of the insulation area 1804 are selectively etched (e.g., selectively wet etched, selectively reactive-ion etched). In some implementations, the portions of the insulation layer 1804 that are selectively etched are the portions that are not covered by the second resist layer 1812 (e.g., portions that are exposed and/or free of coverage of the second resist layer 1812). As further shown at stage 10, when selected portions of the insulation layer 1804 are etched, it exposes selected portions of the dielectric layer 1800.

At stage 13, the second resist layer 1812 is removed (e.g., etched out, stripped). In some implementations, the removing of the second resist layer 1812 does not damage the insulation layer 1804.

At stage 14, a second dielectric layer 1816 is provided. The second dielectric layer 1816 may cover the dielectric layer 1800, the first metal layer 1802, the insulation layer 1804, and/or the second metal layer 1806 in some implementations. In some implementations, the first metal layer 1802 (e.g., metal layer 1802*a* and metal layer 1802*b*), the insulation layer 1804, and the second metal layer 1806 define a capacitor 1414. In some implementations, the capacitor 1414 is a metal-insulator-metal (MIM) capacitor. As shown at stage 12, the insulation layer 1804, and the second metal layer 1806 are planar or substantially planar even though the first metal layer 1802, which includes metal layer 1802*a* and metal layer 1802*b*, or not planar nor substantially planar.

Having described a sequence for providing/manufacturing a capacitor in an integrated device (e.g., semiconductor device), a method for providing/manufacturing a capacitor in an integrated device (e.g., semiconductor device) will now be described below.

Figure 19:
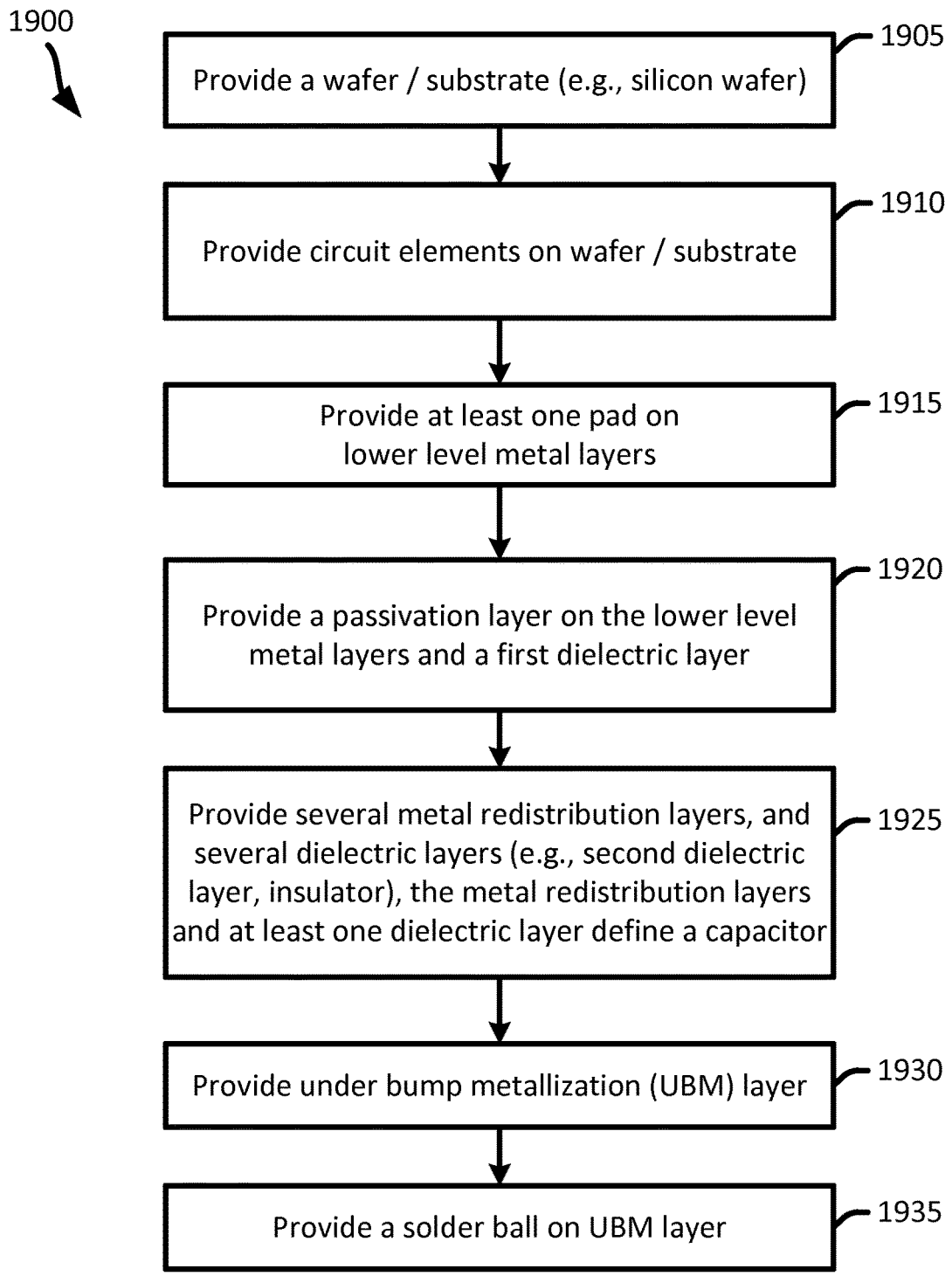
FIG. 19 illustrates an exemplary method for providing/manufacturing a die that includes a capacitor.

Exemplary Method for Providing/Manufacturing an Integrated Device that Includes a Capacitor FIG. 19 illustrates an exemplary method for providing an integrated device that includes a capacitor. In some implementations, the method of FIG. 19 may be used to provide/manufacture the integrated device of FIGS. 2 and/or 3, and/or other integrated devices (e.g., dies) described in the present disclose.

The method provides (at 1905) a substrate (e.g., substrate 1001). In some implementations, providing (at 1905) the substrate includes providing a wafer (e.g., silicon wafer). However, different implementations may use different materials for the substrate (e.g., glass substrate, silicon substrate, glass substrate). The method then provides (at 1910) circuit elements on the substrate. In some implementations, providing (at 1910) the circuit elements may be bypassed.

The method then provides (at 1915) at least one pad (e.g., pad 204, interconnect 1016) on one of the lower level metal layers and dielectric layers (e.g., M7 metal layer). In some implementations, providing (at 1915) the pad includes coupling the pad to one of the lower level metal layer (e.g., the top lower level metal layer, M7 metal layer). In some implementations, the pad is an aluminum pad. However, different implementations may use different materials for the pad. In addition, different implementations may use different processes for providing the pad on the lower level metal layers and dielectric layers. For example, in some implementations, a lithography and/or etching process may be use to provide (at 1915) the pad on the lower level metal and dielectric layers.

The method provides (at 1920) a passivation layer (e.g., passivation layer 206) on the lower level metal layers and dielectric layers.

The method then provides (at 1925) several metal redistribution layers (e.g., metal redistribution layers 1011, 1030) and dielectric layers (e.g., first insulation layer, second insulation layer). In some implementations, one or more of the metal redistribution layers and one or more of the dielectric layer are configured to operate as a capacitor in the integrated device (e.g., die). FIGS. 17A-17C illustrates a sequence/method of how metal layers and one or more dielectric layers may be provided to provide a capacitor (e.g., MIM capacitor) in a redistribution structure (e.g., redistribution portion) of an integrated device. Different implementations may use different materials for the dielectric layers. For example, the first and second insulation layers (which are a form of a dielectric layer) may be a Polybenzoxazole (PbO) layer and/or a polymer layer. In some implementations, one of the dielectric layer is a high k dielectric layer.

The method then provides (at 1930) an under bump metallization (UBM) layer. In some implementations, providing (at 1930) the UBM layer includes coupling the UBM layer to a metal redistribution layer. In some implementations, the UBM layer is a copper layer. The method further provides (at 1935) a solder ball on the UBM layer.

Figure 20A:
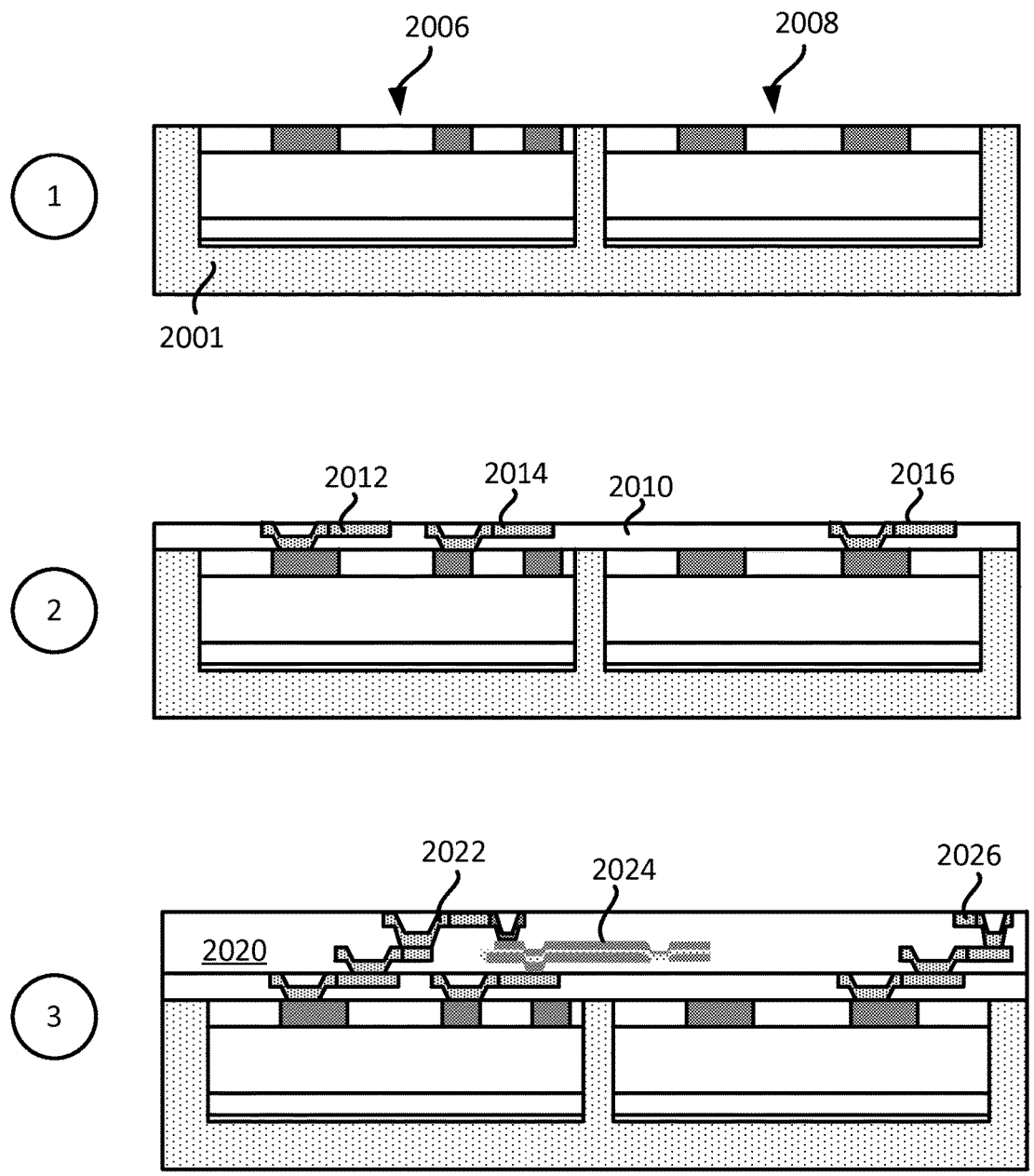
FIG. 20A illustrates part of an exemplary sequence for providing/manufacturing a package that includes a capacitor.
Figure 20B:
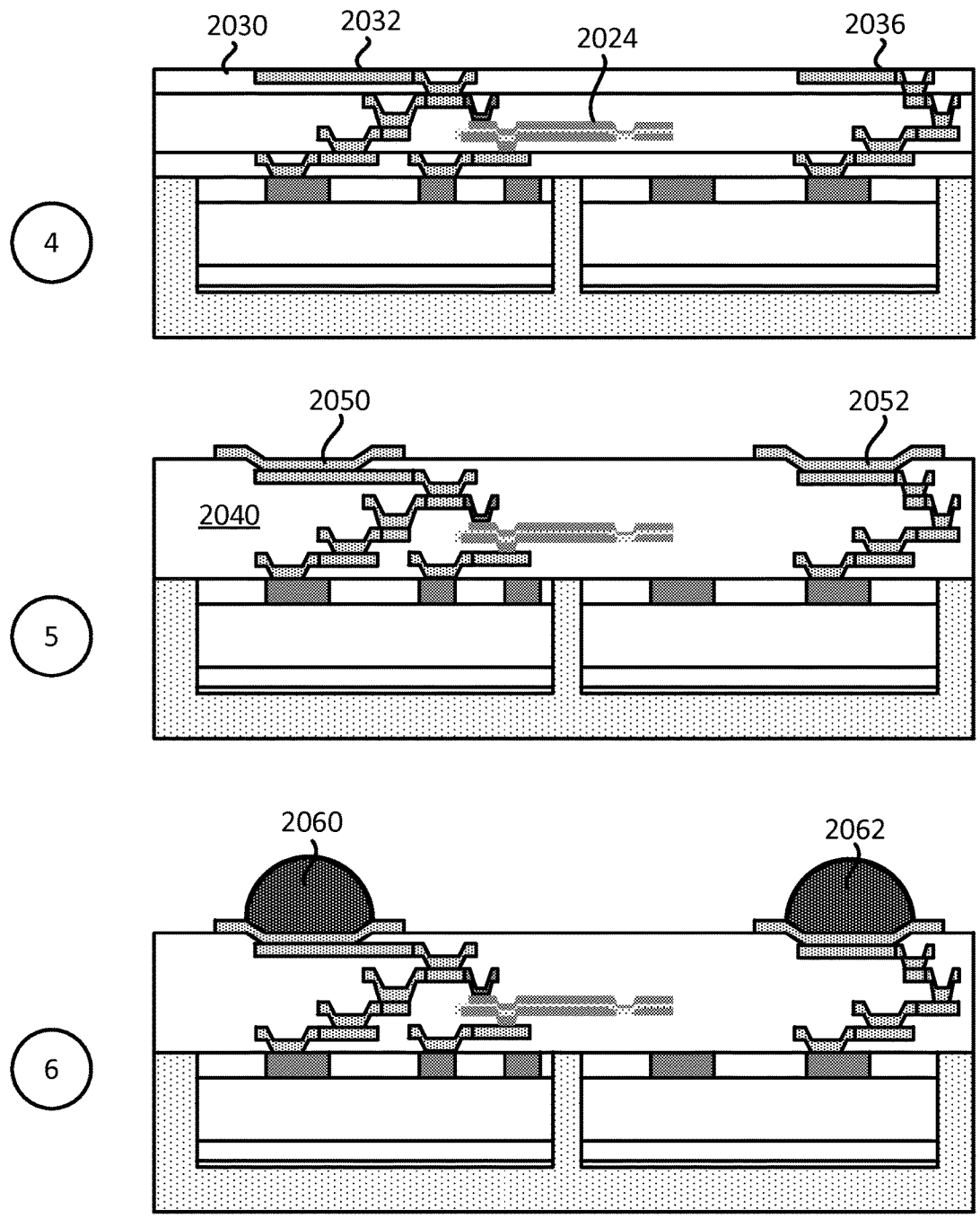
FIG. 20B illustrates part of an exemplary sequence for providing/manufacturing a package that includes a capacitor.

Exemplary Sequence for Providing/Manufacturing an Integrated Device that Includes a Capacitor In some implementations, providing an integrated device (e.g., die package) that includes a capacitor includes several processes. FIGS. 20A-20B illustrate an exemplary sequence for providing an integrated device that includes a capacitor. In some implementations, the sequence of FIGS. 20A-20B may be used to provide/manufacture the integrated device of FIGS. 9, 12, 14 and/or 15, and/or other integrated devices described in the present disclose. It should further be noted that the sequence of FIGS. 20A-20B may combine one or more stages in order to simplify and/or clarify the sequence for providing an integrated device that includes a capacitor.

As shown in stage 1 of FIG. 20A, a substrate (e.g., substrate 2001) is provided. In some implementations, the substrate 2001 is a wafer. Different implementations may use different materials for the substrate (e.g., silicon substrate, glass substrate, ceramic substrate). As shown in stage 1, the substrate 2001 also includes a first integrated device 2006 (e.g., first die), and a second integrated device 2006. The first integrated device 2006 is positioned in a first trench of the substrate 2001, and the second integrated device 2008 is positioned in a second trench of the substrate 2001. Different implementations may user different integrated devices (e.g., dies). An example of an integrated device (e.g., die) that may be use is integrated device 1000, as shown and described in FIG. 10.

At stage 2, a first dielectric layer 2010 (e.g., first insulation layer) and a first metal redistribution layer are provided. The first metal redistribution layer includes a first set of interconnects 2012, a second set of interconnects 2014, and a third set of interconnects 2016. The second set of interconnects 2014 electrically couple the first integrated device 2006 and the second integrated device 2008.

At stage 3, a second dielectric layer 2020 (e.g., second insulation layer) and a second metal redistribution layer are provided. The second metal redistribution layer includes a fourth set of interconnects 2022 and a fifth set of interconnects 2026. At stage 3, a capacitor 2024 is also provided (e.g., formed, fabricated). In some implementations, the process of FIGS. 17A-17C or 18A-18C may be used to provide the capacitor 2024 in the second redistribution layer.

At stage 4 of FIG. 20B, a third set of dielectric layers 2030 (e.g., third insulation layers) and a third set of metal redistribution layers are provided. The third set of dielectric layers 2030 may includes one or more dielectric layers. The third set of metal redistribution layers includes a seventh set of interconnects 2032, an and eighth set of interconnects 2036. In some implementations, the interconnects 2032 and 2036 may include one or more metal layers.

In some implementations, the capacitor is a MIM capacitor. In some implementations, the capacitor is a decoupling capacitor for a power distribution network (PDN) for an integrated device. In some implementations, the capacitor 2024 includes a first set of metal layers, a first set of insulation layers (e.g., high k dielectric layers), a second set of metal layers. Different implementations may use different configuration of the capacitor 2024, such as the ones described in FIGS. 4-8, 11 and/or 13. In some implementations, stage 5 may represent several stages combined as one. That is, in some implementations, stage 5 may represent several dielectric layers and metal redistribution layers provided sequentially on top of the previous dielectric layer and/or metal redistribution layer. In some implementations, an interconnect may include a via. In some implementations, the capacitor 2024 that is provided may use the method and/or sequence described in FIGS. 17A-17C and/or 18A-18C. However, different implementations may use different processes for providing the capacitor in the redistribution structure (e.g., redistribution portion) of the integrated device.

At stage 5, at least one under bump metallization (UBM) layer is provided. Specifically, a first under bump metallization (UBM) layer 2050 and a second under bump metallization (UBM) layer 2052 are provided. Stage 6 illustrates the set of dielectric layers 2040. In some implementations, the set of dielectric layers 2040 includes the dielectric layers 2010, 2020, and 2030.

At stage 6, at least one solder ball is provided on the UBM layer. Specifically, a first solder ball 2060 is coupled to the first UBM layer 2050, and a second solder ball 2062 is coupled to the second UBM layer 2052.

Having described a sequence for providing/manufacturing a capacitor in an integrated device (e.g., semiconductor device), a method for providing/manufacturing a capacitor in an integrated device (e.g., semiconductor device) will now be described below.

Figure 21:
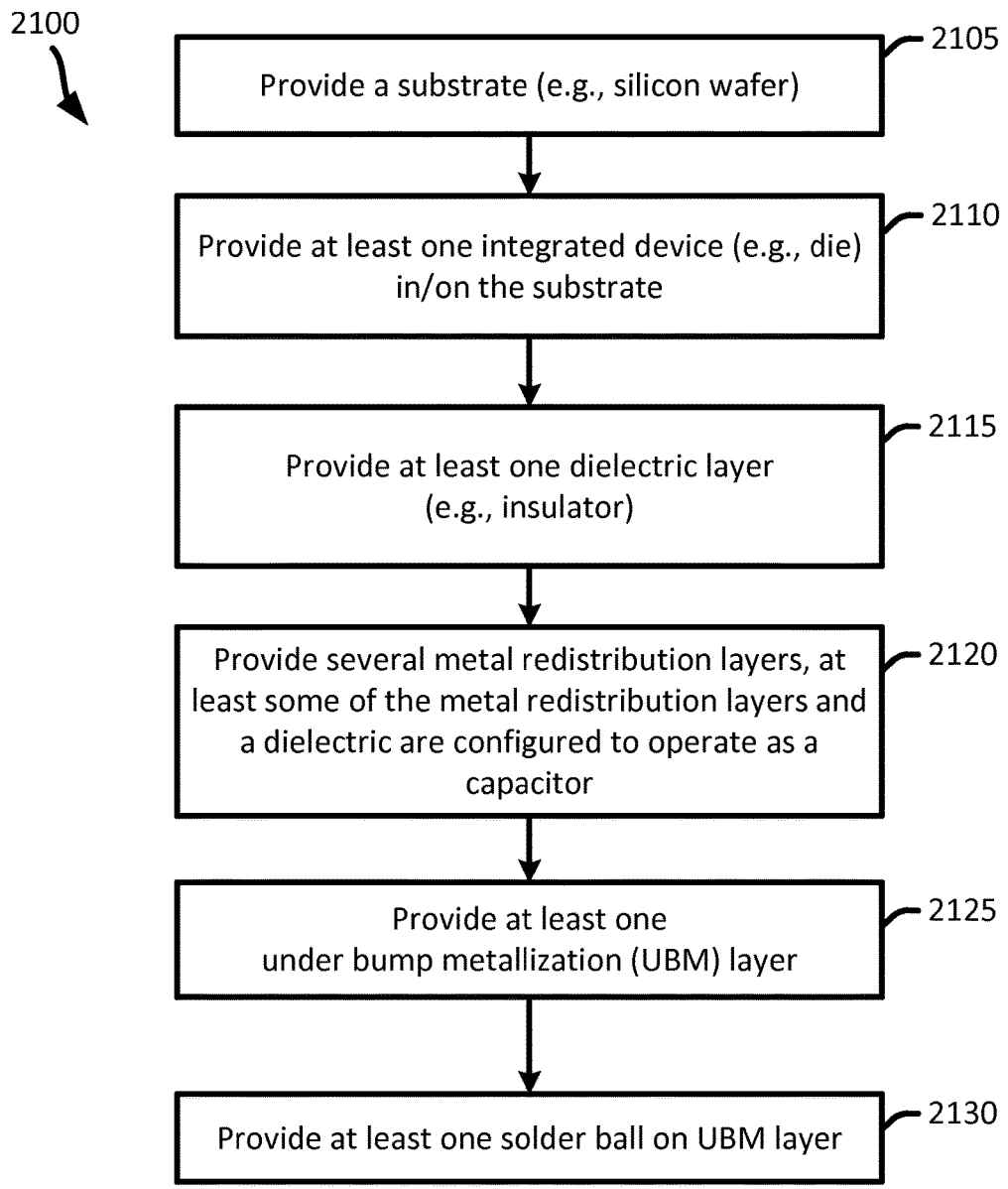
FIG. 21 illustrates an exemplary method for providing/manufacturing a package that includes a capacitor.

Exemplary Method for Manufacturing an Integrated Device that Includes a Capacitor FIG. 21 illustrates an exemplary method for providing an integrated device (e.g., die package) that includes a capacitor. In some implementations, the method of FIG. 21 may be used to provide/manufacture the integrated device of FIGS. 9, 12 and/or 14-15, and/or other integrated devices (e.g., die package) described in the present disclose.

The method provides (at 2105) a substrate (e.g., substrate 2001). In some implementations, providing (at 2105) the substrate includes providing a wafer (e.g., silicon wafer). However, different implementations may use different materials for the substrate (e.g., glass substrate, silicon substrate, glass substrate). In some implementations, providing the substrate may also include providing (e.g., manufacturing) one or more trenches in the substrate. In some implementations, the substrate that is provided (at 2105) includes one or more trenches.

The method then provides (at 2110) at least one integrated device (e.g., die) in or/and on the substrate. In some implementations, an integrated device (e.g., die) may be provided in a trench of the substrate.

The method further provides (at 2115) at least one dielectric layer (e.g., dielectric layers 2010, 2020, 2030, 2040). Different implementations may use different materials for the dielectric layers. For example, first and second insulation layers (which are a form of a dielectric layer) may be a Polybenzoxazole (PbO) layer and/or a polymer layer.

The method also provides (at 2120) several metal redistribution layers and at least one insulation layer. In some implementations, at least some of the redistribution layers and one of the insulation layer are configured to operate as a capacitor. In some implementations, one of the insulation layer (e.g., dielectric layer) is a high k dielectric layer. In some implementations, the capacitor is a MIM capacitor. In some implementations, the capacitor is a decoupling capacitor for a power distribution network (PDN) for an integrated device. In some implementations, the method and/or sequence described in FIGS. 17A-17C may be used to provide (at 2120) the metal layers and insulation layers. However, different implementations may use different processes for providing the capacitor in the redistribution structure (e.g., redistribution portion) of the integrated device.

It should be noted that in some implementations, the method of providing (at 2115) at least one dielectric layer, and providing (at 2120) the metal redistribution layers may be performed sequentially back and forth. That is, in some implementations, the method may provide a first dielectric layer, a first redistribution layer, a second dielectric layer, a second redistribution layer, and so on and so forth.

The method then provides (at 2125) an under bump metallization (UBM) layer. In some implementations, providing (at 2125) the UBM layer includes coupling the UBM layer to a metal redistribution layer. In some implementations, the UBM layer is a copper layer. The method further provides (at 2130) a solder ball on the UBM layer.

Exemplary Electronic Devices

Figure 22:
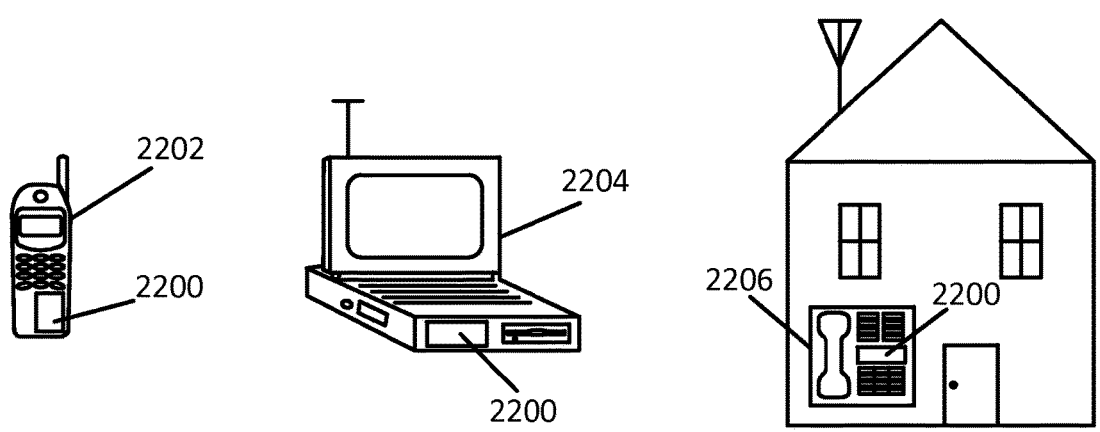
FIG. 22 illustrates various electronic devices that may integrate a semiconductor device, a die, an integrated circuit and/or PCB described herein.

FIG. 22 illustrates various electronic devices that may be integrated with any of the aforementioned semiconductor device, integrated circuit, die, interposer or package. For example, a mobile telephone 2202, a laptop computer 2204, and a fixed location terminal 2206 may include an integrated circuit (IC) 2200 as described herein. The IC 2200 may be, for example, any of the integrated circuits, dice or packages described herein. The devices 2202, 2204, 2206 illustrated in FIG. 22 are merely exemplary. Other electronic devices may also feature the IC 2200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17A-17C, 18A-18C, 19, 20A-20B, 21 and/or 22 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14, 15, 16, 17A-17C, 18A-18C, 19, 20A-20B, 21 and/or 22 and its corresponding description in the present disclosure is not limited to dies and/or ICs. In some implementations, 2, 3, 4, 5, 6, 7, 8, 9, 10, 11, 12, 13, 14, 15, 16, 17A-17C, 18A-18C, 19, 20A-20B, 21 and/or 22 and its corresponding description may be used to manufacture, create, provide, produce integrated devices. In some an integrated device may include a die, a die package, an integrated circuit (IC), a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a substrate; and
   a redistribution structure coupled to the substrate, the redistribution structure comprising:
     a first metal layer comprising a conductive non-planar portion, a first conductive planar piece and a second conductive planar piece, wherein the first conductive planar piece and the second conductive planar piece are not adjacent to each other;
     an insulation layer directly coupled to the first metal layer at the first conductive planar piece;
     a dielectric layer comprising a first dielectric planar portion and a second dielectric planar portion, wherein the first dielectric planar portion is directly between the insulation layer and the conductive non-planar portion of the first metal layer, and the second dielectric planar portion is adjacent to the first conductive planar piece and the second conductive planar piece of the first metal layer; and
     a second metal layer coupled to the insulation layer, wherein the conductive non-planar portion of the first metal layer, the first dielectric planar portion of the dielectric layer, the insulation layer, and the second metal layer are configured to operate as a capacitor in the integrated device.

2. The integrated device of claim 1, wherein the redistribution structure further comprises a set of dielectric layers that encapsulates the first metal layer, the insulation layer, and the second metal layer.

3. The integrated device of claim 1, wherein the insulation layer comprises a first planar surface and a second planar surface, and the second metal layer comprises a planar surface.

4. The integrated device of claim 3, wherein the first planar surface of the insulation layer is directly coupled to the planar surface of the second metal layer, the second planar surface of the insulation layer is directly coupled to the first dielectric planar portion of the dielectric layer and directly coupled to the first conductive planar piece of the first metal layer, and the first dielectric planar portion of the dielectric layer is directly coupled to the conductive non-planar portion of the first metal layer.

5. The integrated device of claim 1, wherein the second metal layer is one of at least titanium (Ti), (TiN), Aluminium Copper (AlCu), titanium copper alloy (TiCu) and/or titanium tungsten copper alloy (TiWCu).

6. The integrated device of claim 1, wherein the second metal layer is over a surface of the integrated device.

7. The integrated device of claim 1, further comprising a first die coupled to the substrate.

8. The integrated device of claim 7, wherein the redistribution structure is coupled to the first die and the substrate.

9. The integrated device of claim 1, wherein the integrated device is one of at least a die, die package, and/or an integrated package device.

10. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. The integrated device of claim 1, wherein the first conductive planar piece of the first metal layer and the conductive non-planar portion of the first metal layer are on a side of the first metal layer abutting a second dielectric layer.

12. An apparatus comprising:
   a substrate; and
   a redistribution structure coupled to the substrate, the redistribution structure comprising:
     a first interconnect means comprising a conductive non-planar portion, a first conductive planar piece and a second conductive planar piece, wherein the first conductive planar piece and the second conductive planar piece are not adjacent to each other;
     an insulating means directly coupled to the first interconnect means at the first conductive planar piece;
     a dielectric means comprising a first dielectric planar portion and a second dielectric planar portion, wherein the first dielectric planar portion is directly between the insulating means and the conductive non-planar portion of the first interconnect means, and the second dielectric planar portion is adjacent to the first conductive planar piece and the second conductive planar piece of the first metal layer; and
     a second interconnect means coupled to the insulating means, wherein the conductive non-planar portion of the first interconnect means, the first dielectric planar portion of the dielectric means, the insulating means, and the second interconnect means are configured to operate as a capacitor in the apparatus.

13. The apparatus of claim 12, wherein the redistribution structure further comprises a set of dielectric layers that encapsulates the first interconnect means, the insulating means, and the second interconnect means.

14. The apparatus of claim 12, wherein the insulating means comprises a first planar surface and a second planar surface, and the second interconnect means comprises a planar surface.

15. The apparatus of claim 14, wherein the first planar surface of the insulating means is directly coupled to the planar surface of the second interconnect means, the second planar surface of the insulating means is directly coupled to the first dielectric planar portion of the dielectric means and directly coupled to the first conductive planar piece of the first interconnect means, and the first dielectric planar portion of the dielectric means is directly coupled to the conductive non-planar portion of the first interconnect means.

16. The apparatus of claim 12, wherein the second interconnect means is one of at least titanium (Ti), (TiN), Aluminium Copper (AlCu), titanium copper alloy (TiCu) and/or titanium tungsten copper alloy (TiWCu).

17. The apparatus of claim 12, wherein the second interconnect means is over a surface of the apparatus.

18. The apparatus of claim 12, further comprising a first die coupled to the substrate.

19. The apparatus of claim 18, wherein the redistribution structure is coupled to the first die and the substrate.

20. The apparatus of claim 12, wherein the apparatus is one of at least a die, die package, and/or an integrated package device.

21. The apparatus of claim 12, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

22. The apparatus of claim 12, wherein the first conductive planar piece of the first interconnect means and the conductive non-planar portion of the first interconnect means are on a side of the first interconnect means abutting a second dielectric layer.

23. A method for manufacturing a capacitor in an integrated device, comprising:
    forming a substrate; and
    forming a redistribution structure such that the redistribution structure is coupled to the substrate, wherein forming the redistribution structure comprises:
        forming a first metal layer of the capacitor, wherein the first metal layer comprises a conductive non-planar portion, a first conductive planar piece and a second conductive planar piece, and the first conductive planar piece and the second conductive planar piece are not adjacent to each other;
        forming an insulation layer of the capacitor, wherein the insulation layer is directly coupled to the first metal layer at the first conductive planar piece;
        forming a dielectric layer of the capacitor, wherein the dielectric layer comprises a first dielectric planar portion and a second dielectric planar portion, wherein the first dielectric planar portion of the dielectric layer is formed directly between the insulation layer and the conductive non-planar portion of the first metal layer, and the second dielectric planar portion is formed adjacent to the first conductive planar piece and the second conductive planar piece of the first metal layer; and
        forming a second metal layer of the capacitor, wherein the second metal layer is coupled to the insulation layer and wherein the conductive non-planar portion of the first metal layer, the insulation layer, the first dielectric planar portion of the dielectric layer, and the second metal layer are configured to operate as a capacitor in the integrated device.

24. The method of claim 23, wherein forming the redistribution structure further comprises forming a set of dielectric layers that encapsulates the first metal layer, the insulation layer, and the second metal layer.

25. The method of claim 23, wherein forming the insulation layer comprises forming a first planar surface and a second planar surface of the insulation layer, wherein forming the second metal layer comprises forming a planar surface of the second metal layer.

26. The method of claim 25, wherein the first planar surface of the insulation layer is directly coupled to the planar surface of the second metal layer, the second planar surface of the insulation layer is directly coupled to the first dielectric planar portion of the dielectric layer and directly coupled to the first conductive planar piece of the first metal layer, and the first dielectric planar portion of the dielectric layer is directly coupled to the conductive non-planar portion of the first metal layer.

27. The method of claim 23, wherein the second metal layer is one of at least titanium (Ti), (TiN), Aluminium Copper (AlCu), titanium copper alloy (TiCu) and/or titanium tungsten copper alloy (TiWCu).

28. The method of claim 23, wherein the second metal layer is over a surface of the integrated device.

29. The method of claim 23, further comprising providing a first die such that the first die is coupled to the substrate.

30. The method of claim 29, wherein the redistribution structure is coupled to the first die and the substrate.

31. The method of claim 23, wherein the integrated device is one of at least a die, die package, and/or an integrated package device.

32. The method of claim 23, wherein the first conductive planar piece of the first metal layer and the conductive non-planar portion of the first metal layer are on a side of the first metal layer abutting a second dielectric layer.

* * * * *